(12) United States Patent
Soyano

(10) Patent No.: US 9,917,031 B2
(45) Date of Patent: Mar. 13, 2018

(54) SEMICONDUCTOR DEVICE, AND METHOD FOR ASSEMBLING SEMICONDUCTOR DEVICE

(71) Applicant: FUJI ELECTRIC CO., LTD., Kawasaki-shi, Kanagawa (JP)

(72) Inventor: Shin Soyano, Shiojiri (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/878,539

(22) Filed: Oct. 8, 2015

(65) Prior Publication Data
US 2016/0035646 A1 Feb. 4, 2016

Related U.S. Application Data

(63) Continuation of application No. PCT/JP2014/071107, filed on Aug. 8, 2014.

(30) Foreign Application Priority Data

Sep. 30, 2013 (JP) ................. 2013-203390
Oct. 29, 2013 (JP) ................. 2013-224234

(51) Int. Cl.
*H01L 23/367* (2006.01)
*H01L 23/498* (2006.01)
(Continued)

(52) U.S. Cl.
CPC .......... *H01L 23/3677* (2013.01); *H01L 21/52* (2013.01); *H01L 23/24* (2013.01);
(Continued)

(58) Field of Classification Search
CPC ... H01L 23/3677; H01L 23/36; H01L 23/367; H01L 23/498; H01L 23/49811;
(Continued)

(56) References Cited

U.S. PATENT DOCUMENTS 5,506,447 A 4/1996 Murakami
5,519,252 A * 5/1996 Soyano ................. H01L 21/56
257/177

(Continued)

FOREIGN PATENT DOCUMENTS

CN 101156241 A 4/2008
JP H07-14940 A 1/1995
(Continued)

OTHER PUBLICATIONS

English Translation of Written Opinion for PCT/JP2014/071107 dated Sep. 9, 2014.*

(Continued)

*Primary Examiner* — Yu Chen
*Assistant Examiner* — Pauline Vu
(74) *Attorney, Agent, or Firm* — Manabu Kanesaka

(57) ABSTRACT

A semiconductor device includes an insulating substrate; a semiconductor element mounted on the insulating substrate; and a radiation block bonded to the semiconductor element. The radiation block includes a three-dimensional radiation portion and a base portion connected to the radiation portion. The radiation portion of the radiation block has a pin shape, a fin shape, or a porous shape.

13 Claims, 34 Drawing Sheets

(51) Int. Cl.
*H01L 21/52* (2006.01)
*H01L 23/36* (2006.01)
*H01L 25/07* (2006.01)
*H01L 25/18* (2006.01)
*H01L 23/24* (2006.01)
*H01L 23/373* (2006.01)
*H01L 23/495* (2006.01)
*H01L 23/00* (2006.01)

(52) U.S. Cl.
CPC .......... *H01L 23/36* (2013.01); *H01L 23/3735* (2013.01); *H01L 23/49562* (2013.01); *H01L 23/49575* (2013.01); *H01L 23/49811* (2013.01); *H01L 25/07* (2013.01); *H01L 25/18* (2013.01); *H01L 24/40* (2013.01); *H01L 24/45* (2013.01); *H01L 24/48* (2013.01); *H01L 24/73* (2013.01); *H01L 2224/40095* (2013.01); *H01L 2224/40225* (2013.01); *H01L 2224/45124* (2013.01); *H01L 2224/48091* (2013.01); *H01L 2224/48227* (2013.01); *H01L 2224/48472* (2013.01); *H01L 2224/73221* (2013.01); *H01L 2924/13055* (2013.01); *H01L 2924/13091* (2013.01); *H01L 2924/181* (2013.01)

(58) Field of Classification Search
CPC ............... H01L 21/52; H01L 23/49575; H01L 23/49562; H01L 23/3735
See application file for complete search history.

(56) References Cited

U.S. PATENT DOCUMENTS

| | | | | |
|---|---|---|---|---|
| 5,834,842 A * | 11/1998 | Majumdar | .......... | H01L 23/3107 257/675 |
| 5,886,408 A * | 3/1999 | Ohki | ........... | H01L 23/16 257/705 |
| 6,265,771 B1 * | 7/2001 | Ference | .............. | H01L 23/3677 257/676 |
| 6,364,669 B1 * | 4/2002 | Andric | ................... | H01L 23/32 174/541 |
| 2002/0185718 A1 * | 12/2002 | Mikubo | ............... | H01L 23/433 257/678 |
| 2003/0015778 A1 * | 1/2003 | Soyano | ................ | H01L 23/045 257/678 |
| 2003/0038362 A1 * | 2/2003 | Nomura | ............... | H01L 23/047 257/706 |
| 2003/0197255 A1 | 10/2003 | Nakajima et al. | | |
| 2004/0164402 A1 * | 8/2004 | Yoshimura | .......... | H01L 23/3737 257/706 |
| 2006/0096299 A1 * | 5/2006 | Mamitsu | ............... | H01L 23/473 62/3.2 |
| 2008/0128896 A1 | 6/2008 | Toh et al. | | |
| 2008/0150102 A1 | 6/2008 | Yokomae et al. | | |
| 2008/0158824 A1 * | 7/2008 | Aoki | ................... | H01L 23/24 361/711 |
| 2009/0057929 A1 * | 3/2009 | Sasaki | ................ | H01L 23/3107 257/796 |
| 2009/0102040 A1 * | 4/2009 | Specht | ............... | H01L 21/4817 257/690 |
| 2009/0116197 A1 * | 5/2009 | Funakoshi | .......... | H01L 21/4882 361/719 |
| 2009/0139704 A1 | 6/2009 | Otoshi et al. | | |
| 2009/0237886 A1 * | 9/2009 | Iwai | ...................... | H01L 23/373 361/708 |
| 2009/0243079 A1 * | 10/2009 | Lim | .................. | H01L 23/49531 257/691 |
| 2009/0246910 A1 * | 10/2009 | Taniguchi | ........... | H01L 23/5385 438/107 |
| 2010/0127387 A1 | 5/2010 | Soda et al. | | |
| 2011/0031612 A1 * | 2/2011 | Mitsui | ................. | H01L 23/3107 257/713 |
| 2011/0108964 A1 * | 5/2011 | Obara | ............... | H01L 23/49861 257/675 |
| 2011/0214904 A1 | 9/2011 | Ohsawa et al. | | |
| 2012/0014069 A1 * | 1/2012 | Zeng | ................... | H01L 23/4334 361/718 |
| 2012/0043662 A1 | 2/2012 | Ohno | | |
| 2012/0241953 A1 * | 9/2012 | Yamada | .............. | H01L 23/4334 257/737 |
| 2013/0075932 A1 * | 3/2013 | Schwarzer | .......... | H01L 23/5226 257/774 |
| 2013/0224891 A1 * | 8/2013 | Takizawa | ................ | H01L 22/10 438/15 |
| 2013/0240909 A1 | 9/2013 | Hiramatsu et al. | | |
| 2014/0159216 A1 * | 6/2014 | Ishino | ................. | H01L 23/4006 257/675 |
| 2014/0197532 A1 * | 7/2014 | Ide | .......................... | H01L 23/36 257/706 |
| 2014/0246783 A1 * | 9/2014 | Nishizawa | ............ | H01L 25/072 257/774 |

FOREIGN PATENT DOCUMENTS

| | | | |
|---|---|---|---|
| JP | 11121662 A * | 4/1999 | |
| JP | 11204703 A * | 7/1999 | |
| JP | H11-204703 A | 7/1999 | |
| JP | 2000-323630 A | 11/2000 | |
| JP | 2001-036005 A | 2/2001 | |
| JP | 2002-237556 A | 8/2002 | |
| JP | 2003-031765 A | 1/2003 | |
| JP | 2003-100987 A | 4/2003 | |
| JP | 2004-006967 A | 1/2004 | |
| JP | 2004-363295 A | 12/2004 | |
| JP | 2005-322784 A | 11/2005 | |
| JP | 2005322784 A * | 11/2005 | |
| JP | 2006-294699 A | 10/2006 | |
| JP | 2007-042738 A | 2/2007 | |
| JP | 2007042738 A * | 2/2007 | |
| JP | 2008042041 A * | 2/2008 | |
| JP | 2008-098585 A | 4/2008 | |
| JP | 2008-166680 A | 7/2008 | |
| JP | 2009141101 A * | 6/2009 | |
| JP | 2009-188329 A | 8/2009 | |
| JP | 2009-200088 A | 9/2009 | |
| JP | 2013-021371 A | 1/2013 | |
| WO | 2008/142760 A1 | 5/2007 | |
| WO | 2011/092859 A1 | 8/2011 | |
| WO | 2012/070261 A1 | 5/2012 | |

OTHER PUBLICATIONS

PCT, "International Search Report for International Application No. PCT/JP2014/071107".
Japan Patent Office, "Office Action for Japanese Patent Application No. 2015-539010," dated Nov. 1, 2016.
China Patent Office, "Office Action for Chinese Patent Application No. 201480021473.8," dated Jul. 4, 2017.

* cited by examiner

SEMICONDUCTOR DEVICE, AND METHOD FOR ASSEMBLING SEMICONDUCTOR DEVICE

CROSS-REFERENCES TO RELATED APPLICATIONS

The present application is a Continuation application of PCT International Application No. PCT/JP2014/071107 filed Aug. 8, 2014, and claiming priority from Japanese Application No. 2013-203390 filed Sep. 30, 2013, and Japanese Application No. 2013-224234 filed Oct. 29, 2013, the disclosure of which is incorporated herein.

TECHNICAL FIELD

The present invention relates to a semiconductor device, a method for assembling a semiconductor device, a semiconductor device component, and a unit module. More particularly, the invention relates to a semiconductor device including a power semiconductor element, a method for assembling the semiconductor device, a semiconductor device component used in the semiconductor device, and a unit module.

BACKGROUND ART

As a semiconductor device, a power semiconductor module has been known in which one or more power semiconductor elements (semiconductor chips) are provided in a case and the case is sealed with a sealing material. In the power semiconductor module used in, for example, an inverter circuit, a switching element, such as an insulated gate bipolar transistor (IGBT) or a metal oxide semiconductor field effect transistor (MOSFET) and a passive element, such as a free wheeling diode (FWD) are used as the semiconductor elements. The power semiconductor elements are mounted as semiconductor chips made of silicon or silicon carbide (SiC) on an insulating substrate and are electrically connected to electrical circuits or terminals formed on the insulating substrate. For example, an electrode formed on the upper surface of the semiconductor chip of the power semiconductor module is electrically connected to the electrical circuit or the terminal formed on the insulating substrate by an aluminum bonding wire or a copper lead (conductive plate). The bonding wire or the lead has a function of transferring heat generated from the semiconductor chip, in addition to the electrical connection function.

In recent years, the power semiconductor module is used under a higher capacity condition than the related art or is used in a high temperature environment such as an in-vehicle environment. In addition, with a reduction in the size of the semiconductor chip and an increase in the density of the semiconductor chips in the case, the heating temperature of the semiconductor chip is likely to increase.

One of measures for improving the dissipation of heat generated from the semiconductor chip to suppress an increase in the heating temperature of the semiconductor chip is to increase the number of aluminum bonding wires which are bonded to the electrodes formed on the upper surface of the semiconductor chip. However, with a reduction in the size of the semiconductor chip, it is difficult to bond a large number of bonding wires to the upper surface of the semiconductor chip.

In a semiconductor device in which a copper lead (conductive plate) is soldered to the electrode formed on the upper surface of the semiconductor chip, the lead can be bonded to the upper surface of the semiconductor chip by solder in a wide range. Therefore, this type of semiconductor device has a higher radiation performance than the structure in which the bonding wire is bonded. However, when the semiconductor chip and the lead are bonded by solder, long-term reliability is reduced since the difference between the thermal expansion coefficient of the semiconductor chip and the thermal expansion coefficient of the lead is large. Therefore, it is necessary to improve the long-term reliability.

A semiconductor device with high reliability has been proposed in which a semiconductor chip and a printed circuit board that is provided above the semiconductor chip are connected by a plurality of post electrodes and the plurality of post electrodes is connected to the semiconductor chip (Patent Document 1). However, in the semiconductor device disclosed in Patent Document 1, since the printed circuit board is connected to the semiconductor chip through the post electrodes, it is difficult for a large amount of current to flow to the printed circuit board and costs are higher than that in the structure in which the lead is used. In addition, the position of the post electrode is determined by the position of a through hole provided in the printed circuit board. Therefore, flexibility in the arrangement of the semiconductor chip in the power semiconductor module is not high.

A semiconductor device has been proposed in which a heat spreader is bonded to an electrode of a semiconductor chip and the heat spreader and a lead are bonded to each other by laser welding (Patent Document 2). The heat spreader used in the semiconductor device disclosed in Patent Document 2 is generally a simple copper plate and there is a difference between the thermal expansion coefficient of the heat spreader and the thermal expansion coefficient of the semiconductor chip. Therefore, it is necessary to improve reliability for a temperature cycle when a power semiconductor module is used.

CITATION LIST

Patent Document

Patent Document 1: JP 2013-21371 A
Patent Document 2: JP 2008-98585 A

DISCLOSURE OF THE INVENTION

Problem to be Solved by the Invention

The invention has been made in order to solve the problems of the semiconductor devices according to the related art. An object of the invention is to provide a semiconductor device which can improve the dissipation of heat generated from a semiconductor chip and has high reliability for a temperature cycle when used, a method for assembling the semiconductor device, a semiconductor device component used in the semiconductor device, and a unit module.

Means for Solving Problem

In order to achieve the object, the following semiconductor device, method for assembling a semiconductor device, semiconductor device component, and unit module are provided. According to a first aspect of the invention, there is provided a semiconductor device including: an insulating substrate; a semiconductor element that is mounted on the insulating substrate; and a radiation block that is bonded to the semiconductor element and includes a three-dimensional radiation portion.

According to a second aspect of the invention, there is provided a method for assembling a semiconductor device. The method includes: preparing a unit module including an insulating substrate, a semiconductor element that is mounted on the insulating substrate, and a radiation block that is bonded to the semiconductor element and includes a three-dimensional radiation portion; fixing at least one unit module to a metal substrate; forming a frame in the periphery of the insulating substrate in the unit module fixed to the metal substrate; and bonding a case that encloses the metal substrate to the metal substrate.

According to a third aspect of the invention, there is provided a semiconductor device component that is mounted and used in a semiconductor device including a conductive plate. The semiconductor device component includes: an insulating substrate; a semiconductor element that is mounted on the insulating substrate; and a radiation block that is bonded to the semiconductor element and includes a three-dimensional radiation portion. The semiconductor element is electrically connected to the conductive plate through the radiation block.

According to a fourth aspect of the invention, there is provided a unit module that is mounted and used in a semiconductor device including a conductive plate and a metal plate. The unit module includes: an insulating substrate; a semiconductor element that is mounted on the insulating substrate; and a radiation block that is bonded to the semiconductor element and includes a three-dimensional radiation portion. The unit module is fixed to the metal substrate. The semiconductor element is electrically connected to the conductive plate through the radiation block.

Effect of the Invention

According to the above-mentioned aspects of the invention, since the radiation block including the three-dimensional radiation portion is bonded to the semiconductor element, it is possible to effectively dissipate heat generated from the semiconductor chip from the radiation portion of the radiation block. In addition, since the radiation block has a structure which can disperse thermal stress, thermal stress caused by the difference in thermal expansion coefficient between the radiation block and the semiconductor chip is reduced and it is possible to improve long-term reliability.

MODE(S) FOR CARRYING OUT THE INVENTION

Embodiments of a power semiconductor module (semiconductor device) according to the invention will be described in detail with reference to the drawings.

Embodiment 1

Figure 1A:
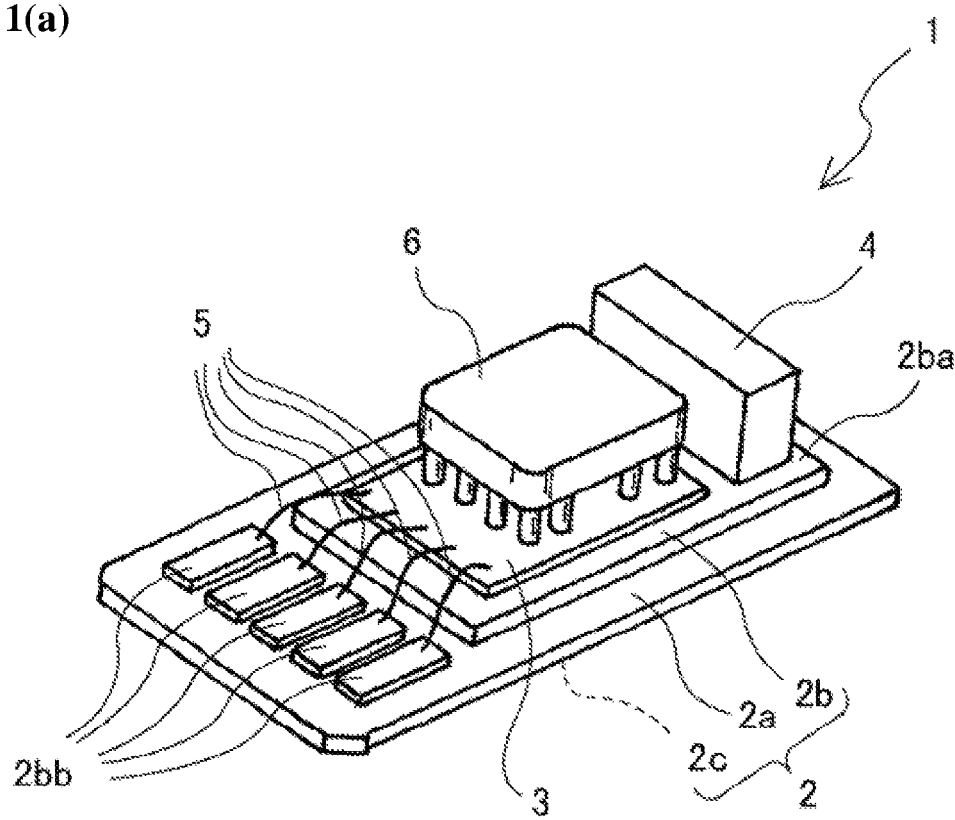
FIGS. 1(a), 1(b) are diagrams illustrating a semiconductor device component according to Embodiment 1 of the invention.

FIG. 1(a) is a perspective view schematically illustrating a semiconductor device component 1 according to Embodiment 1 of the invention. The semiconductor device component 1 is used to form a power semiconductor module which will be described below. In the semiconductor device component 1 illustrated in FIG. 1(a), a semiconductor chip 3 is mounted on an insulating substrate 2. The insulating substrate 2 includes an insulating plate 2a which is made of a ceramic material, such as a silicon oxide, alumina, or an aluminum nitride, a metal film 2b which is bonded to one surface of the insulating plate 2a, and a metal film 2c which is bonded to the other surface of the insulating plate 2a. Specifically, the metal films 2b and 2c are, for example, copper films. The copper film may be plated with, for example, nickel. The metal film 2c is provided on the rear surface of the insulating plate 2a and is not illustrated in FIG. 1(a). The metal film 2b is selectively formed on the insulating plate 2a and thus has a circuit pattern including a region 2ba which is connected to an electrode formed on a lower surface of the semiconductor chip 3 and a region 2bb which is connected to an electrode (for example, a gate electrode) formed on an upper surface of the semiconductor chip 3.

One semiconductor chip 3 serving as a semiconductor element is soldered to the region 2ba of the metal film 2b having the circuit pattern formed thereon. The semiconductor chip 3 is, for example, an IGBT chip or a MOSFET chip. A reverse conducting IGBT (RC-IGBT) may be used as the semiconductor chip 3. The RC-IGBT chip is provided with an FWD and a combination of an IGBT and the FWD is formed by one chip. Therefore, the RC-IGBT chip is preferable. Next, an example in which the semiconductor chip 3 is an RC-IGBT chip will be described. In the example illustrated in the drawings, one semiconductor chip 3 is mounted on one insulating substrate 2. However, two or more semiconductor chips 3 may be mounted on one insulating substrate 2. For example, two chips may be mounted on one insulating substrate 2 and the two chips may form a combination of the IGBT chip and the FWD chip.

In addition to the semiconductor chip 3, a feed block 4 is connected to the region 2ba of the metal film 2b and power can be supplied from the outside to the electrode formed on the lower surface of the semiconductor chip 3 through the feed block 4. When the semiconductor device component 1 is used as a unit module which will be described below, the feed block 4 functions as an electrode for supplying power to the semiconductor chip 3. The region 2bb of the metal film 2b is electrically connected to the electrode formed on the upper surface of the semiconductor chip 3 by a bonding wire 5 made of, for example, aluminum.

A radiation block 6 including a three-dimensional radiation portion is soldered to an electrode (for example, an emitter electrode or an anode electrode) other than the electrode connected to the bonding wire 5 on the upper surface of the semiconductor chip 3. For example, a conductive plate, which will be described below, is connected to the radiation block 6 such that power can be supplied from the outside to the electrode formed on the upper surface of the semiconductor chip 3 through the radiation block 6.

Figure 1B:
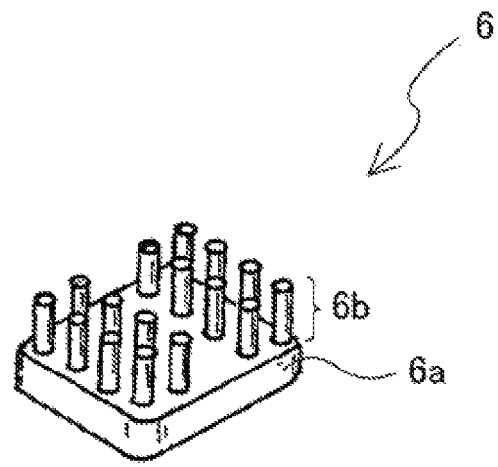

The radiation block 6 is made of a metal material with high conductivity and high thermal conductivity, such as copper or aluminum. Therefore, the radiation block 6 has a high radiation performance. FIG. 1(b) is a perspective view illustrating the inverted radiation block 6. As illustrated in FIG. 1(b), the radiation block 6 includes a base portion 6a and a radiation portion 6b. The radiation portion 6b is connected to the electrode on the upper surface of the semiconductor chip 3 and includes three-dimensional members, specifically, a plurality of cylindrical pins which extends from the base portion 6a. In the example illustrated in FIGS. 1(a), 1(b), 4×4 pins, that is, a total of 16 pins are formed in four rows and four columns. In the radiation block 6, the radiation portion 6b has a larger surface area than the base portion 6a. Therefore, the radiation portion 6b can effectively dissipate heat.

The radiation block 6 can be manufactured by integrally molding the base portion 6a and the pins of the radiation portion 6b using, for example, die casting, brazing, or cutting. For example, the diameter of the pin can be in the range of about 0.5 mmφ to 1.0 mmφ, considering the balance between thermal conductivity and a reduction in stress. The length of the pin can be in the range of about 1 mm to 2 mm. The thickness of the base portion can be in the range of about 1 mm to 2 mm, considering laser welding to the conductive plate.

In the semiconductor device component 1 according to this embodiment, since the radiation block 6 is bonded to the semiconductor chip 3, heat generated from the semiconductor chip 3 is transferred to the radiation block 6 and the radiation block 6 effectively dissipates the heat. As a result, the semiconductor device component 1 according to this embodiment can improve the dissipation of heat generated from the semiconductor chip 3. In addition, the radiation portion 6b of the radiation block 6 has a structure that can disperse thermal stress, as compared to a solid shape such as the shape of the base portion 6a. Therefore, thermal stress caused by a difference in thermal expansion coefficient between the semiconductor chip 3 and the radiation block 6 is reduced by the radiation portion 6b. As a result, the semiconductor device component 1 according to this embodiment can improve the long-term reliability of a thermal cycle.

In the semiconductor device component 1 according to this embodiment, since the radiation portion 6b of the radiation block 6 includes the plurality of pins extending from the base portion 6a, it is possible to ensure a sufficient solder thickness. In addition, in a bonding portion between the radiation block 6 and the semiconductor chip 3, a solder fillet is formed around each pin. Therefore, it is possible to increase the total length of the fillet, as compared to a solid shape, and thus perform soldering with high reliability. Furthermore, when the semiconductor chip 3 and the radiation block 6 are bonded to each other, air which causes a void is easily taken out of the bonding portion. Therefore, the occurrence of voids is reduced and it is possible to perform soldering with high reliability.

The semiconductor device component 1 according to this embodiment is mounted on a metal substrate, is accommodated in a case provided with terminals, and is connected to the terminals. Then, the case is filled with a sealing material. In this way, a power semiconductor module is formed. Since the semiconductor device component 1 is connected to the terminals through the base portion 6a of the radiation block 6, it is possible to reduce the electrical resistance and thermal resistance between the semiconductor chip 3 and the terminals.

Embodiment 2

A semiconductor device component according to Embodiment 2 will be described with reference to FIG. 2(a). The semiconductor device component according to Embodiment 2 differs from the semiconductor device component according to Embodiment 1 only in the shape of a radiation block. Therefore, FIG. 2(a) illustrates only the radiation block of the semiconductor device component according to this embodiment.

Figure 2A:
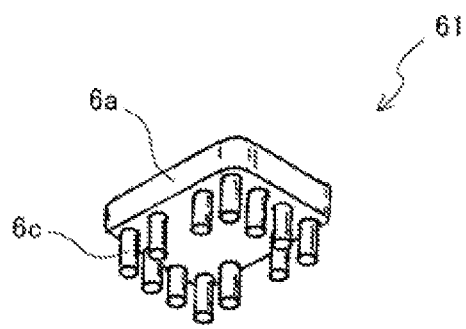
FIGS. 2(a)-2(d) are perspective views illustrating a modification of a radiation block of the semiconductor device component illustrated in FIGS. 1(a), 1(b)

A radiation block 61 illustrated in the perspective view of FIG. 2(a) includes a base portion 6a and a plurality of cylindrical pins 6c which extends from the base portion 6a. The plurality of cylindrical pins 6c forms a radiation portion. The radiation block 61 differs from the radiation block 6 according to Embodiment 1 illustrated in FIG. 1(b) in that the pins 6c are provided in the periphery of the base portion 6a so as to be arranged in a line along the edge.

The radiation block 61 differs from the radiation block 6 illustrated in FIGS. 1(a), 1(b) only in the arrangement of the pins. Therefore, the radiation block 61 has the same effect as the radiation block 6. In addition, since the pins 6c are provided along the edge of the base portion 6a, it is possible to easily check the state of a solder fillet which is formed at the leading end of the pin 6c during soldering. In addition, since the heating temperature of a central portion of the semiconductor chip 3 is high, the pins 6c of the radiation block 61 are not formed at a position corresponding to the central portion of the semiconductor chip 3. Therefore, it is possible to improve the long-term reliability of a thermal cycle.

Embodiment 3

Figure 2B:
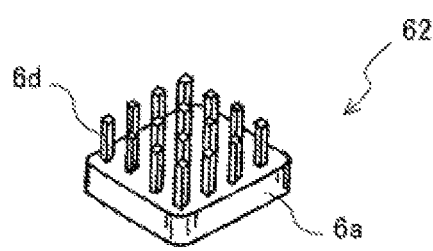
Figure 2C:
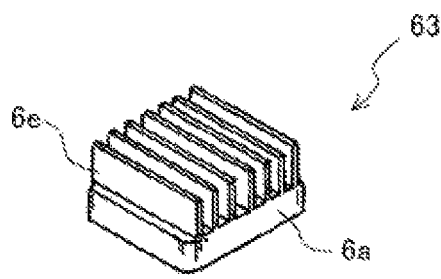
Figure 2D:
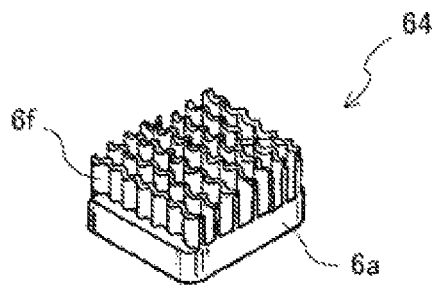

FIGS. 2(b) to 2(d) are perspective views illustrating the inverted state of modifications of the shape of the radiation portion of the radiation block, with the radiation portion upside down. A radiation block 62 illustrated in FIG. 2(b) includes a base portion 6a and a plurality of prism-shaped pins 6d which extends from the base portion 6a. In the example illustrated in FIG. 2(b), a total of 16 prism-shaped pins 6d are formed in four rows and four columns. The plurality of prism-shaped pins 6d forms a radiation portion. The radiation block 62 has the same effect as the radiation block 6 illustrated in FIGS. 1(a), 1(b) even though it includes the prism-shaped pins 6d.

Embodiment 4

A radiation block 63 illustrated in FIG. 2(c) includes a base portion 6a and a plurality of linear fins 6e which extends from the base portion 6a and is arranged in parallel to each other. In the example illustrated in FIG. 2(c), seven fins 6e are formed and the length of the fin 6e is equal to the length of one side of the base portion. The plurality of fins 6e forms a radiation portion. The radiation block 63 has the same effect as the radiation block 6 illustrated in FIGS. 1(a), 1(b) even though radiation portion has the fin shape.

Embodiment 5

A radiation block 64 illustrated in FIG. 2(d) includes a base portion 6a and a plurality of wave-shaped fins 6f which extends from the base portion 6a and is arranged in parallel to each other. In the example illustrated in FIG. 2(d), seven wave-shaped fins 6f are formed. The plurality of wave-shaped fins 6f forms a radiation portion. The radiation block 64 has the same effect as the radiation block 6 illustrated in FIGS. 1(a), 1(b) even though radiation portion includes the wave-shaped fins.

Embodiment 6

Figure 3A:
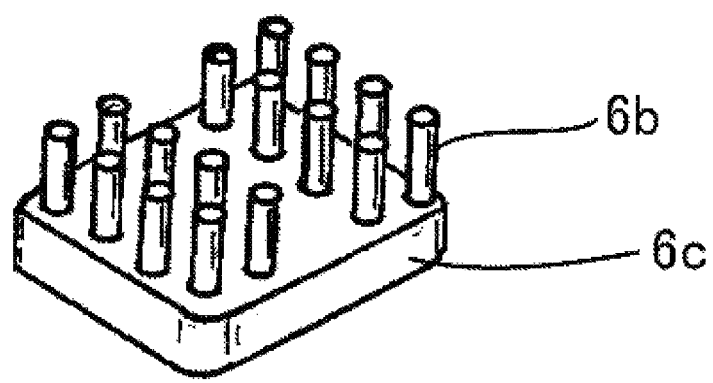
FIGS. 3(a), 3(b) are perspective views illustrating another example of the radiation block of the semiconductor device component illustrated in FIGS. 1(a), 1(b)
Figure 3B:
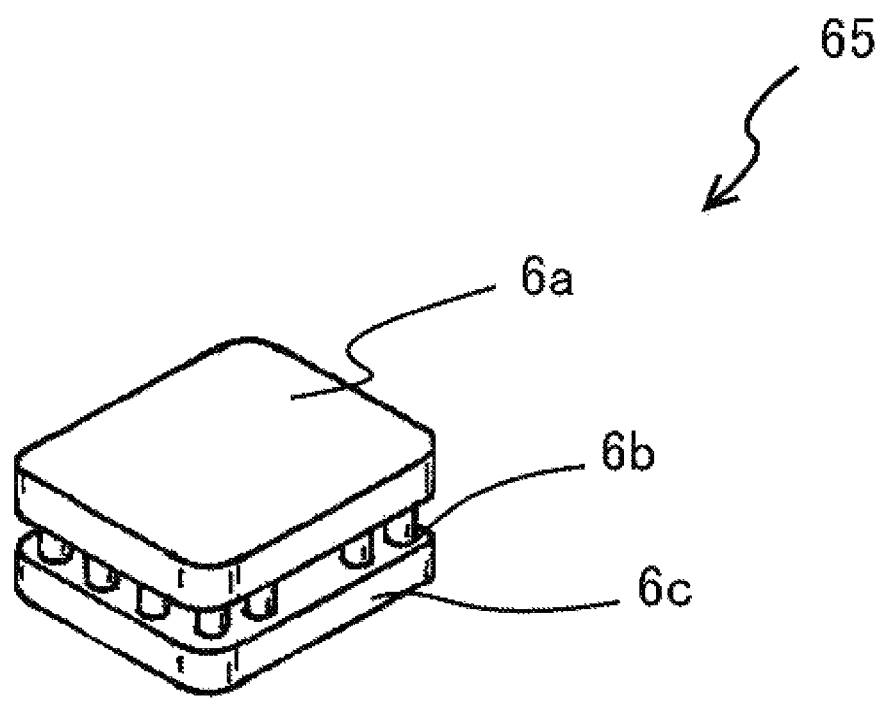

FIGS. 3(a), 3(b) illustrate another example of the radiation block. A radiation block 65 illustrated in the perspective view of FIG. 3(b) includes a base portion 6a, a radiation portion 6b including a plurality of cylindrical pins which extends from the base portion 6a, and a second base portion 6c which has one surface connected to the leading end of each pin of the radiation portion 6b and the other surface soldered to a semiconductor chip 3. FIG. 3(a) is a perspective view illustrating the radiation portion 6b and the second base portion 6c. The radiation portion 6b includes a plurality of cylindrical pins, similarly to the radiation portion 6b illustrated in FIG. 1(b). The second base portion 6c has the same shape and dimensions as the first base portion. For example, the radiation block 65 illustrated in FIGS. 3(a), 3(b) can be manufactured by bonding the second plate-shaped base portion 6c to the leading end of each pin of the radiation block 6 illustrated in FIG. 1(b).

Since the radiation block 65 includes the radiation portion 6b, the radiation portion 6b can dissipate heat to effectively reduce the temperature of the semiconductor chip 3. In addition, it is possible to reduce thermal stress caused by the difference in thermal expansion coefficient between the semiconductor chip 3 and the radiation block 6. Therefore, in a semiconductor device to which the radiation block 65 is applied, the contact area between the semiconductor chip 3 and the radiation block 65 is large, but it is possible to ensure the long-term reliability of a thermal cycle.

In the radiation block 65, the second base portion 6c is soldered to the semiconductor chip 3 and a contact area with the semiconductor chip 3 is larger than that in the radiation block 6 illustrated in FIG. 1(b). Therefore, the dissipation of heat generated from the semiconductor chip 3 or electrical connectivity with the semiconductor chip 3 is improved.

Embodiment 7

Figure 4A:
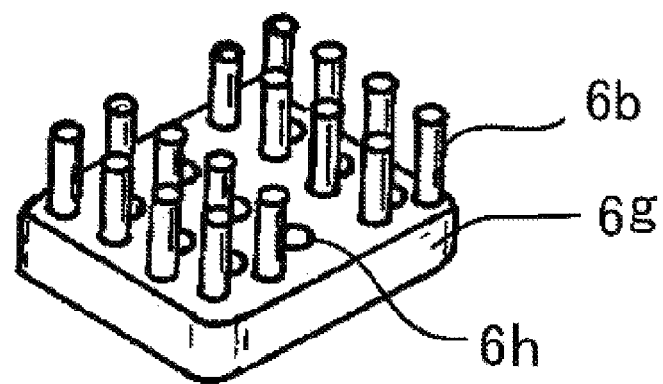
FIGS. 4(a), 4(b) are perspective views illustrating another example of the radiation block of the semiconductor device component illustrated in FIGS. 1(a), 1(b)
Figure 4B:
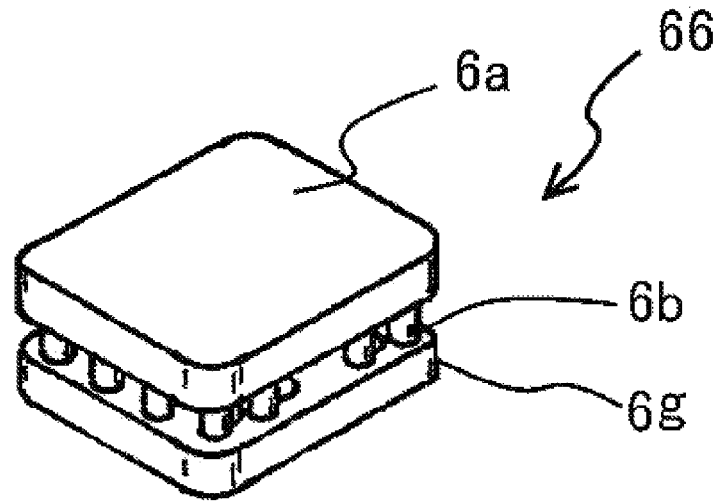

FIGS. 4(a), 4(b) illustrate another example of the radiation block. A radiation block 66 illustrated in the perspective view of FIG. 4(b) includes a base portion 6a, a radiation portion 6b including a plurality of cylindrical pins which extends from the base portion 6a, and a second base portion 6g which has one surface connected to the leading end of each pin of the radiation portion 6b and the other surface soldered to a semiconductor chip 3. FIG. 4(a) is a perspective view illustrating the radiation portion 6b and the second base portion 6g. The second base portion 6g of the radiation block 66 differs from the second base portion 6c of the radiation block 65 illustrated in FIG. 3(a) in that a plurality of through holes 6h is formed in the second base portion 6g of the radiation block 66 according to this embodiment. In the example illustrated in FIG. 3(a), a total of nine through holes 6h are formed in three rows and three columns between the pins which are formed in four rows and four columns.

The radiation block 66 has the same effect as the radiation block 65 illustrated in FIGS. 3(a), 3(b). In addition, since the through holes 6h are formed in the second base portion 6g, air which causes a void is easily taken out via the through holes 6h during the bonding between the semiconductor chip 3 and the radiation block 66. Therefore, the occurrence of voids is reduced and it is possible to perform soldering with high reliability. In addition, the through holes 6h cause the length of a solder fillet to be greater than that in the radiation block 65 according to Embodiment 6. Therefore, it is possible to improve the long-term reliability of a thermal cycle.

Embodiment 8

Figure 5:
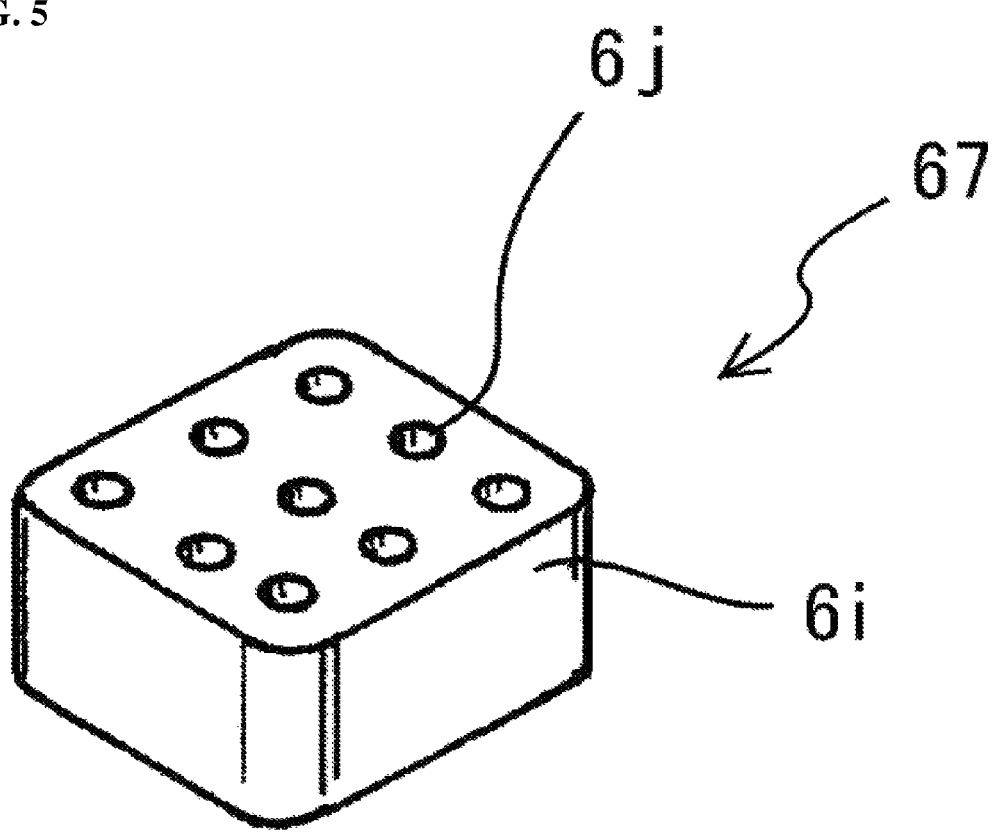
FIG. 5 is a perspective view illustrating another example of the radiation block of the semiconductor device component illustrated in FIGS. 1(a), 1(b)

FIG. 5 illustrates another example of the radiation block. A radiation block 67 illustrated in FIG. 5 includes a plate-shaped base portion 6i in which a plurality of through holes 6j is formed. In the example illustrated in FIG. 5, a total of nine through holes 6j are formed in three rows and three columns. Since the through holes 6j are formed in the base portion 6i of the radiation block 67, the surface area of the radiation block 67 is greater than that of a structure without the through holes. Therefore, in the radiation block 67, the base portion 6i serves as a radiation portion. As a result, the radiation portion can effectively dissipate heat.

In the radiation block 67, since the through holes 6g are formed in the base portion 6f, it is possible to ensure a sufficient solder thickness. In addition, in a bonding portion between the radiation block 67 and the semiconductor chip 3, a solder fillet is formed around each through hole 6g. Therefore, it is possible to perform soldering with high reliability. When the semiconductor chip 3 and the radiation block 67 are bonded to each other, air which causes a void is easily taken out via the through holes 6g. Therefore, the occurrence of voids is reduced and it is possible to perform soldering with high reliability. Preferably, the (inside) diameter of the through hole 6g is in the range of about 0.5 mmφ to 2.0 mmφ and the thickness of the radiation block 67 is in the range of about 1 mm to 5 mm.

The radiation block of the semiconductor device according to the invention is not limited to those described in Embodiments 1 to 8. For example, when a plurality of semiconductor chips 3 is provided adjacent to each other on the insulating substrate 2, one radiation block may be provided to lay across the plurality of semiconductor chips 3.

Embodiment 9

The semiconductor device component 1 illustrated in FIGS. 1(a), 1(b) can be used as a unit module including one or two or more semiconductor chips in a power semiconductor module which will be described below. The unit module as an embodiment of the semiconductor device according to the invention will be described with reference to FIGS. 6(a)-6(d). FIGS. 6(a)-6(d) are schematic perspective views illustrating a unit module 10 in the order of assembly processes.

Figure 6A:
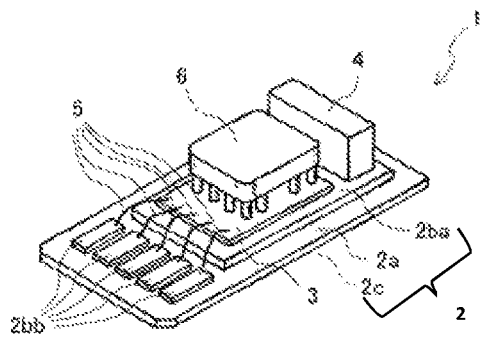
FIGS. 6(a)-6(d) are diagrams illustrating a unit module according to an embodiment of the invention.

A semiconductor device component 1 illustrated in FIG. 6(a) is the same as the semiconductor device component 1 illustrated in FIG. 1(a). In FIG. 6(a), the same members as those in FIG. 1(a) are denoted by the same reference numerals and the description thereof will not be repeated below.

Figure 6B:
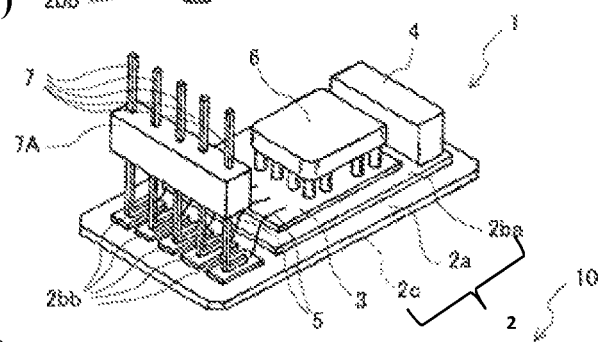

Lead pins 7 are bonded to the region 2bb of the metal film 2b of the insulating substrate 2 in order to use the semiconductor device component 1 as the unit module 10 (FIG. 6(b)). The lead pins 7 are used as control terminals of the semiconductor device component 1. Each lead pin 7 is fixed by a lead pin block 7A.

Figure 6C:
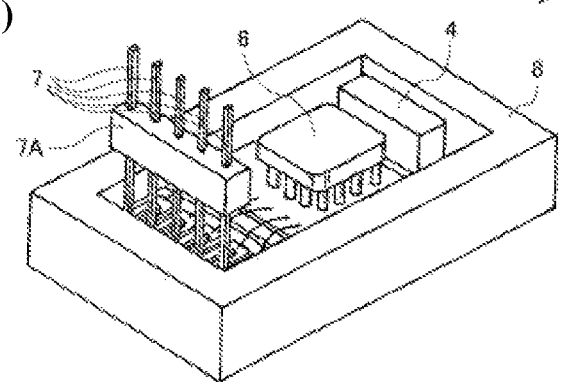
Figure 6D:
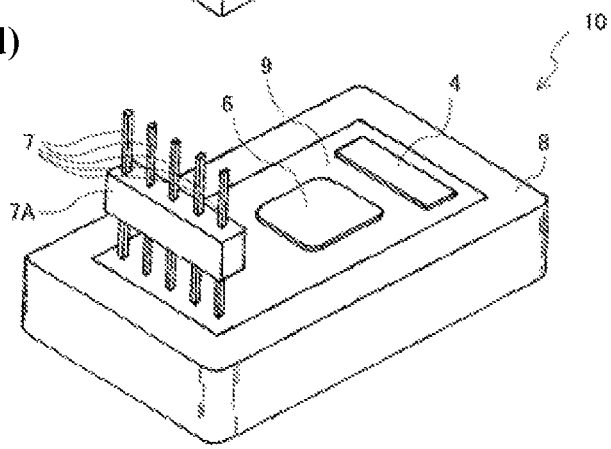

The semiconductor device component 1 illustrated in FIG. 6(b) may be fixed as the unit module 10 of the power semiconductor module to a metal substrate. In a preferred embodiment of the invention, as illustrated in FIGS. 6(c) and 6(d), a unit module 10 in which a frame 8 is provided in the periphery of the insulating substrate 2 of the semiconductor device component 1 is fixed to the metal substrate. The frame 8 is bonded and fixed to the insulating substrate 2 by a resin.

Since the unit module 10 includes the frame 8, the frame 8 can be filled with a sealing material 9 (FIG. 6(d)). The sealing material 9 filling the frame 8 is gel or resin with high heat resistance and/or high fluidity, such as silicon gel or epoxy resin.

The radiation block 6, the feed block 4, and the lead pins 7 are exposed from the sealing material 9. The radiation block 6 and the feed block 4 are arranged such that the upper surfaces thereof are substantially parallel to the main surface of the unit module 10 and are structured so as to be electrically connected to a conductive plate of the power semiconductor module.

Embodiment 10

Figure 7:
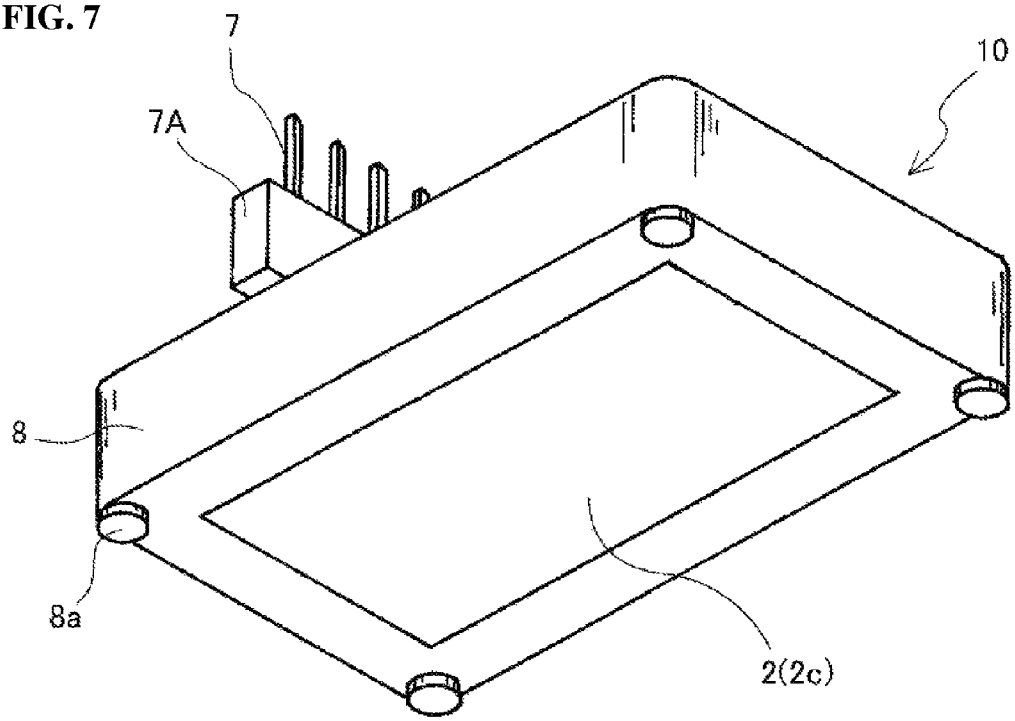
FIG. 7 is a perspective view illustrating a modification of the unit module illustrated in FIGS. 6(c), 6(d)

FIG. 7 is a perspective view illustrating a modification of the unit module 10 illustrated in FIGS. 6(c), 6(d) and illustrates a preferred aspect of the rear surface of a frame 8, as obliquely viewed from the bottom. The unit module 10 illustrated in FIG. 7 includes protrusions 8a provided at four corners of the bottom of the frame 8. When the insulating substrate 2 of the unit module 10 is bonded to a metal substrate 11, the protrusions 8a make it possible to obtain a constant solder thickness.

Figure 8A:
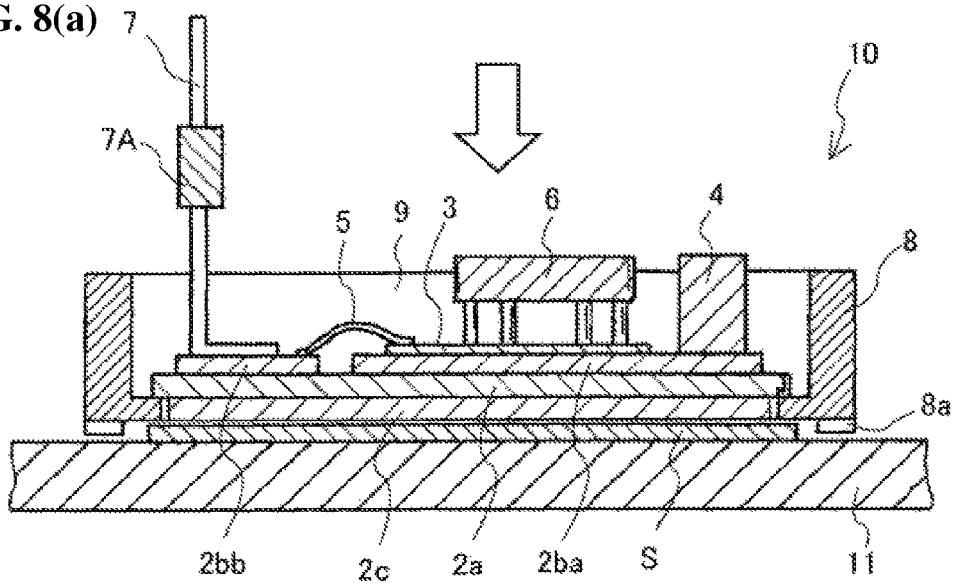
FIGS. 8(a), 8(b) are cross-sectional views illustrating the unit module illustrated in FIG. 7.
Figure 8B:
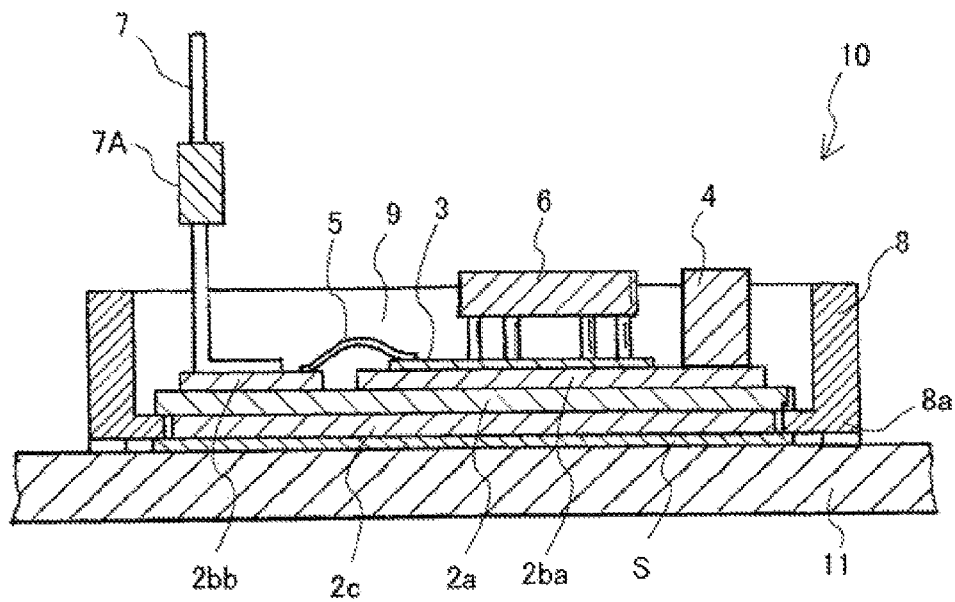

FIGS. 8(a), 8(b) are schematic cross-sectional views illustrating the unit module 10 and the metal substrate 11 before and after the unit module 10 having the protrusions 8a formed on the frame 8 is soldered to the metal substrate 11. In FIGS. 8(a), 8(b), the same members as those in the unit module 10 are denoted by the same reference numerals and the description thereof will not be repeated below.

Before soldering, paste solder S is applied onto the metal substrate 11 (FIG. 8(a)). In this case, the thickness of the solder S is slightly greater than a desired value. Then, the unit module 10 is placed on the metal substrate 11 (FIG. 8(b)). When the leading ends of the protrusions 8a provided in the frame 8 of the unit module 10 contact the metal substrate 11, the solder S closely contacts metal substrate 11 and the metal film 2c of the insulating substrate 2 of the unit module 10. The thickness of the solder S is restricted to the height of the protrusions 8a and is constant. The metal substrate 11 having the unit module 10 placed thereon is heated in a heating furnace and the metal substrate 11 and the unit module 10 is bonded by the reflow of the solder. In addition to the paste solder, various types of solder can be used as the solder S. For example, plate-shaped solder, a brazing material, or paste including silver nanoparticles may be used.

Embodiment 11

Figure 9A:
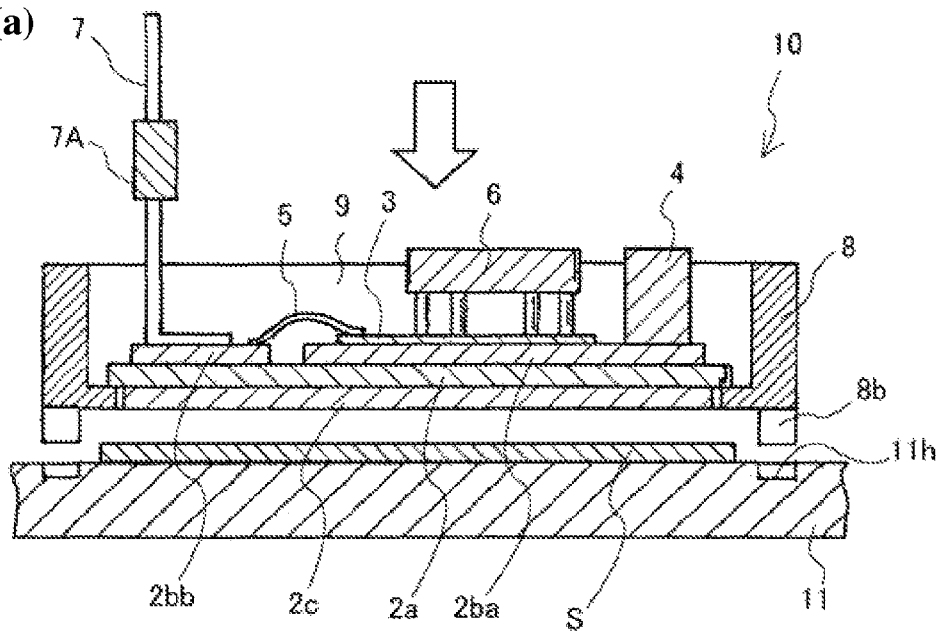
FIGS. 9(a), 9(b) are cross-sectional views illustrating a modification of the unit module illustrated in FIG. 7.
Figure 9B:
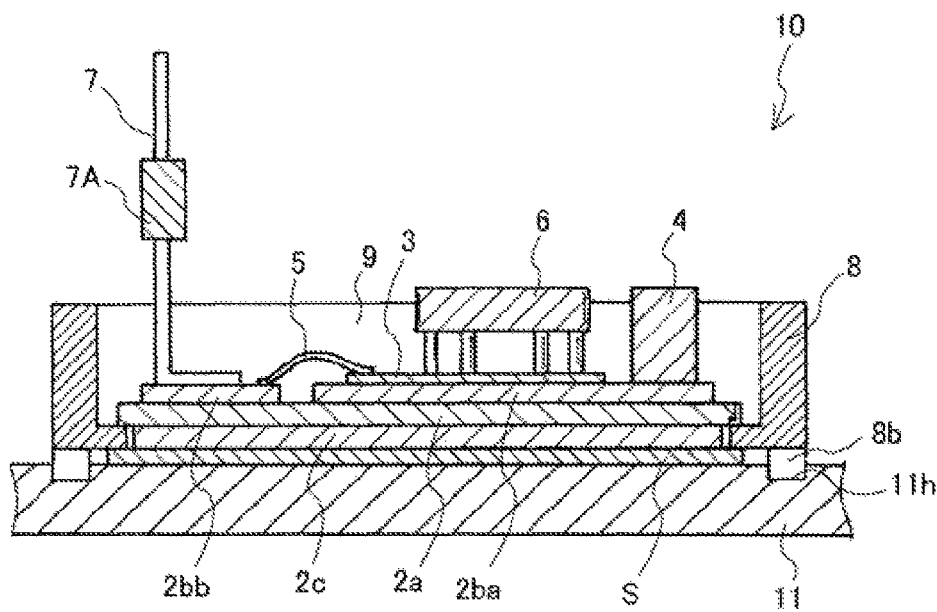

Another preferred aspect of the frame 8 includes a protrusion with a height greater than the thickness of solder S. FIGS. 9(a), 9(b) are cross-sectional views illustrating a unit module 10 and a metal substrate 11 before and after the unit module 10 having protrusions 8b formed on a frame 8 is soldered to the metal substrate 11. The protrusion 8b illustrated in FIGS. 9(a), 9(b) has a height greater than the thickness of solder S.

Before soldering, the paste solder S is applied onto the metal substrate 11 (FIG. 9(a)). In this case, the thickness of the solder S is slightly greater than a desired value. Holes 11h corresponding to the protrusions 8b are formed in the metal substrate 11. The depth of the hole 11h is equal to the sum of the height of the protrusion 8b of the frame 8 and the desired thickness of the solder S. Then, the unit module 10 is placed on the metal substrate 11 (FIG. 9(b)). At that time, the leading end of the protrusion 8b provided on the frame 8 of the unit module 10 is fitted to the hole 11h formed in the metal substrate 11. Then, the unit module 10 is located at a predetermined position of the metal substrate 11. In addition, the solder S contacts the metal substrate 11 and the metal film 2c of the insulating substrate 2 of the unit module 10. The thickness of the solder S is restricted to a value corresponding to the difference between the height of the protrusion 8b and the depth of the hole 11h and the solder S has a constant thickness. The metal substrate 11 having the unit module 10 placed thereon is heated in a heating furnace and the metal substrate 11 and the unit module 10 are bonded to each other by the reflow of the solder.

In this case, since the holes corresponding to the protrusions 8b are formed in the surface of the metal substrate 11, the protrusions 8b can be used to position the unit module 10 when the unit module 10 is fixed to the metal substrate 11. In addition, the thickness of the solder can be constant.

Embodiment 12

As an embodiment of the semiconductor device according to the invention, a power semiconductor module using a unit module 10 and a method for assembling the power semiconductor module will be described with reference to FIGS. 10(a)-10(d). FIGS. 10(a)-10(d) are schematic perspective views illustrating the assembly process of a power semiconductor module 20 in time series. The power semiconductor module 20 illustrated in FIG. 10(c) is a so-called 6-in-1 power semiconductor module in which six unit modules 10 illustrated in FIG. 6(d) are fixed to a metal substrate 11. For example, the power semiconductor module 20 forms a three-phase inverter circuit.

Figure 10A:
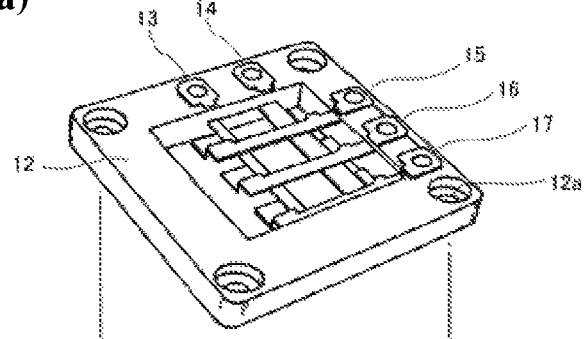
FIGS. 10(a)-10(d) are diagrams illustrating a power semiconductor module as a semiconductor device according to an embodiment of the invention.
Figure 10B:
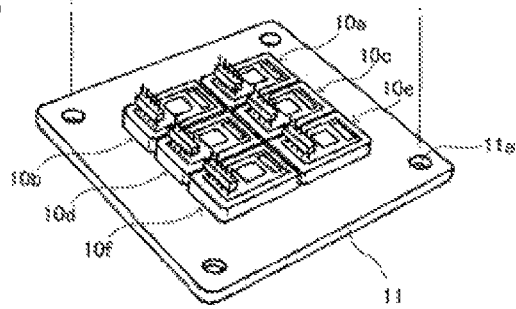
Figure 10C:
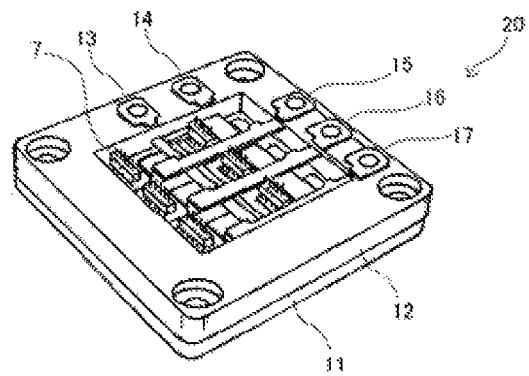
Figure 10D:
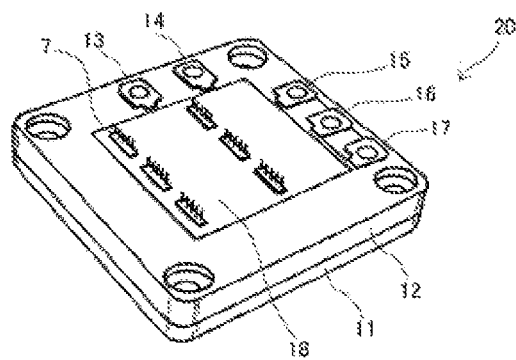

A power semiconductor module 20 illustrated in FIG. 10(d) includes a metal substrate 11, a unit module 10 (lead pins 7 of the unit module 10 are illustrated in FIG. 10(d)) which is fixed to the metal substrate 11, and a case 12 which accommodates the metal substrate 11 and the unit module 10. The case 12 is filled with a sealing material 18.

FIGS. 10(a) to 10(c) illustrate a process of assembling the power semiconductor module 20 illustrated in FIG. 10(d) in time series. First, as illustrated in FIGS. 10(a) and 10(b), six unit modules 10a to 10f, the metal substrate 11, and the case 12 are prepared.

Bolt attachment holes 11a are formed at four corners of the metal substrate 11.

The case 12 is made of a resin. Terminals 13 to 17 which are electrically connected to the radiation blocks 6 or the feed blocks 4 of the unit modules 10 are integrally formed by insert molding and are exposed from the surface of the case 12. Bolt attachment holes 12a are formed at four corners of the case 12.

The unit modules 10a to 10f having the same structure as the unit module 10 illustrated in FIG. 6(d) are components of the power semiconductor module 20 forming a three-phase inverter circuit, and are denoted by reference numerals 10a to 10f for convenience. The terminals 13 to 17 which are formed in the case by insert molding include conductive plates which are arranged in a predetermined array for forming the three-phase inverter circuit at positions corresponding to the unit modules 10a to 10f.

Solder paste is applied to a predetermined position of the metal substrate 11, and the unit modules 10a to 10f are arranged. Then, heating is performed to solder the metal substrate 11 and the unit modules 10a to 10f. In this case, when the protrusions 8a illustrated in FIGS. 7 and 8(a), 8(b) are provided on the bottom of the frame 8 of each of the unit modules 10a to 10f, the use of the protrusions 8a makes it possible to maintain a constant solder thickness. When the protrusions 8b illustrated in FIGS. 9(a), 9(b) are provided on the bottom of the frame 8 of each of the unit modules 10a to 10f, the use of the protrusions 8b makes it easy to position the unit modules 10a to 10f relative to the metal substrate 11 and to maintain a constant solder thickness.

Then, as illustrated in FIG. 10(c), the case 12 is bonded and fixed to the metal substrate 11 having the unit modules 10a to 10f soldered thereto. In addition, the conductive plates of the terminals 13 to 17 of the case 12 and the radiation blocks 6 and the feed blocks 4 of the unit modules 10a to 10f are bonded so as to be electrically connected to each other. The conductive plates can be bonded to the radiation blocks 6 and the feed blocks 4 by laser welding.

Then, as illustrated in FIG. 10(d), the case is filled with the sealing material 18. In this way, the assembly of the power semiconductor module 20 is completed. The sealing material 18 is, for example, an epoxy resin or silicon gel.

In the power semiconductor module 20 according to this embodiment, the semiconductor chip 3 is fixed in the form of the unit module 10 to the metal substrate 11. The use of the unit module 10 used in the power semiconductor module makes it possible to freely adjust the distance between the chips on the metal substrate 11 and thus to reduce thermal interference between the chips. In addition, the unit module 10 has the structure in which the semiconductor chip 3 is covered with the sealing material 9 and the upper surface of each of the radiation block 6 and the feed block 4 is exposed from the sealing material 9. Therefore, the semiconductor chip 3 is protected from sputters during laser welding.

When the unit module 10 is used in the power semiconductor module, the number or combination of unit modules 10 can be adjusted to manufacture a 1-in-1, 2-in-1, 6-in-1 or 7-in-1 power semiconductor module. In addition, when a case having a shape and terminals corresponding to each power semiconductor module is prepared, it is possible to manufacture the power semiconductor module with ease. Furthermore, when the same unit modules 10 are connected in parallel to each other on the metal substrate 11, it is possible to increase the capacity of the power semiconductor module.

When the unit module 10 has the frame 8, it is possible to change the type of sealing material 9 filling the frame 8 and the type of sealing material 18 filling the case 12 having the unit modules 10 accommodated therein. In general, there is a concern that the sealing material will deteriorate due to heat generated from the semiconductor chip. Therefore, it is preferable to use a sealing material with heat resistance. However, the sealing material in a region that is close to the semiconductor chip is greatly affected by heat generated from the semiconductor chip and the sealing material in a region that is away from the semiconductor chip is little affected by heat. Therefore, it is considered that the sealing material in the region that is away from the semiconductor chip does not need to have the same heat resistance as the sealing material in the region that is close to the semiconductor chip. For this reason, the sealing material 9 with high heat resistance is used in the frame 8 of the unit module 10 and a relatively inexpensive sealing material 18 is used in the case 12 having the unit modules 10 accommodated therein. Therefore, in the power semiconductor module 20, it is possible to use the sealing material having both high heat resistance and low costs.

Embodiment 13

Another example of the assembly method of the power semiconductor module 20 will be described with reference to FIGS. 11(a)-11(d). FIGS. 11(a) to 11(d) are perspective views schematically illustrating the assembly process of the power semiconductor module 20 in time series. The finished form of the power semiconductor module 20 illustrated in FIG. 11(d) is the same as that of the power semiconductor module 20 illustrated in FIG. 10(c).

Figure 11A:
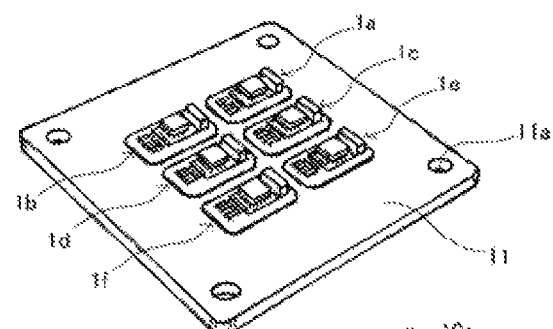
FIGS. 11(a)-11(d) are diagrams illustrating another method for assembling the power semiconductor module illustrated in FIGS. 10(a)-10(d)

First, as illustrated in FIG. 11(a), a metal substrate 11 and semiconductor device components 1a to 1f as unit modules are prepared. The semiconductor device components 1a to 1f have the same structure as the semiconductor device component 1 illustrated in FIG. 6(a), are components of the power semiconductor module 20 forming a three-phase inverter circuit, and are denoted by reference numerals 1a to 1f for convenience.

Solder paste is applied to a predetermined position of the metal substrate 11 and the semiconductor device components 1a to 1f are arranged. Then, heating is performed to solder the metal substrate 11 and the semiconductor device components 1a to 1f. In this case, the semiconductor device components 1a to 1f are positioned relative to the metal substrate 11 by a jig of an assembly apparatus.

Figure 11B:
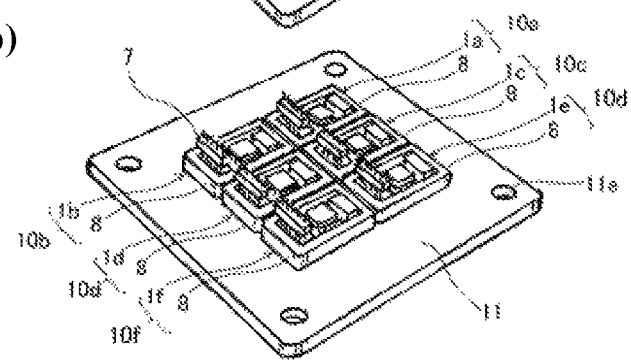
Figure 11C:
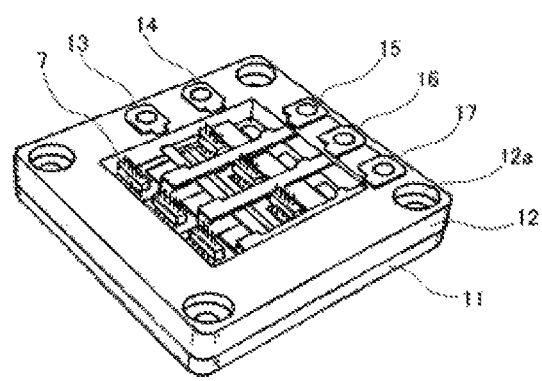
Figure 11D:
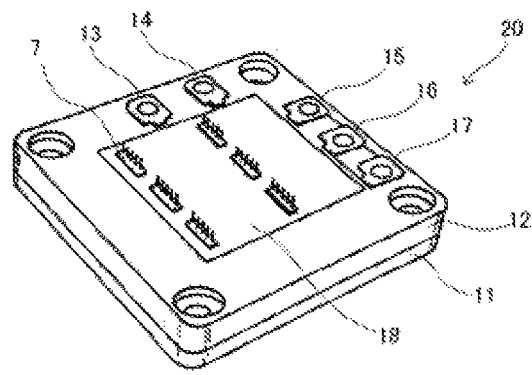

Then, as illustrated in FIG. 11(b), lead pins 7 are bonded to each of the semiconductor device components 1a to 1f and the frame 8 is bonded and fixed to each of the semiconductor device components 1a to 1f. Then, preferably, the frame 8 is filled with a sealing material with heat resistance. In this way, the unit modules 10a to 10f illustrated in FIG. 10(a) are manufactured on the metal substrate 11. The subsequent processes are the same as those illustrated in FIGS. 10(a) to 10(c).

That is, a case 12 is bonded and fixed to the metal substrate 11 having the unit modules 10a to 10f manufactured thereon. In addition, the conductive plates of the terminals 13 to 17 of the case 12 are bonded to the radiation blocks 6 and the feed blocks 4 of the unit modules 10a to 10f such that they are electrically connected to each other (FIG. 11(c)). Then, the case 12 is filled with a sealing material 18. In this way, the assembly of the power semiconductor module 20 is completed (FIG. 11(d)).

In the assembly process illustrated in FIGS. 11(a)-11(d), the semiconductor device components 1a to 1f without the frame 8 are fixed to the metal substrate 11. This process is the same as the power semiconductor module manufacturing process according to the related art. Then, a new process of sticking and fixing the frames 8 to the semiconductor device components 1a to 1f on the metal substrate 11 is performed. The frame 8 is provided in the periphery of the insulating substrate 2 of each of the unit modules 10a to 10f by this process.

The power semiconductor module 20 which is assembled by the process described with reference to FIGS. 11(a)-11(d) has the same structure as the power semiconductor module 20 illustrated in FIGS. 10(a)-10(d). Therefore, the power semiconductor module 20 has the same effect as the power semiconductor module 20 illustrated in FIGS. 10(a)-10(d).

Embodiment 14

Next, another embodiment of the semiconductor device component according to the invention will be described with reference to the drawings. First, in the case of the semiconductor device component 1 according to Embodiment 1 described with reference to FIGS. 1(a), 1(b), as illustrated in FIG. 6(b), the lead pins 7 are bonded to the region 2bb of the metal film 2b of the insulating substrate 2. The lead pins 7 are fixed by the lead pin block 7A. In contrast, in the semiconductor device component according to this embodiment, the shape of a lead pin block is different from that of the lead pin block 7A.

Figure 12A:
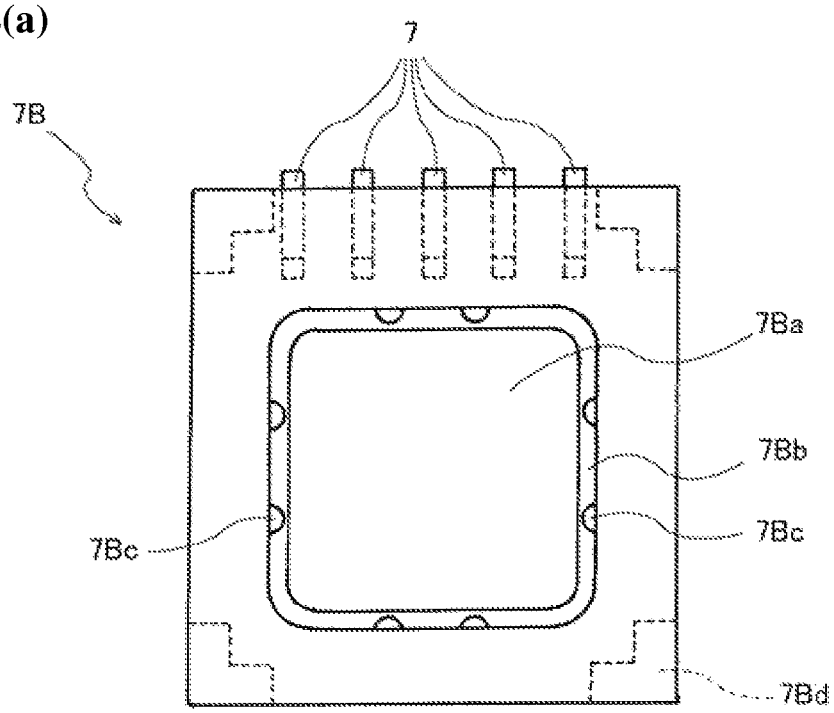
FIGS. 12(a), 12(b) are perspective views illustrating a lead pin block which is used in a semiconductor device component according to another embodiment of the invention.
Figure 12B:
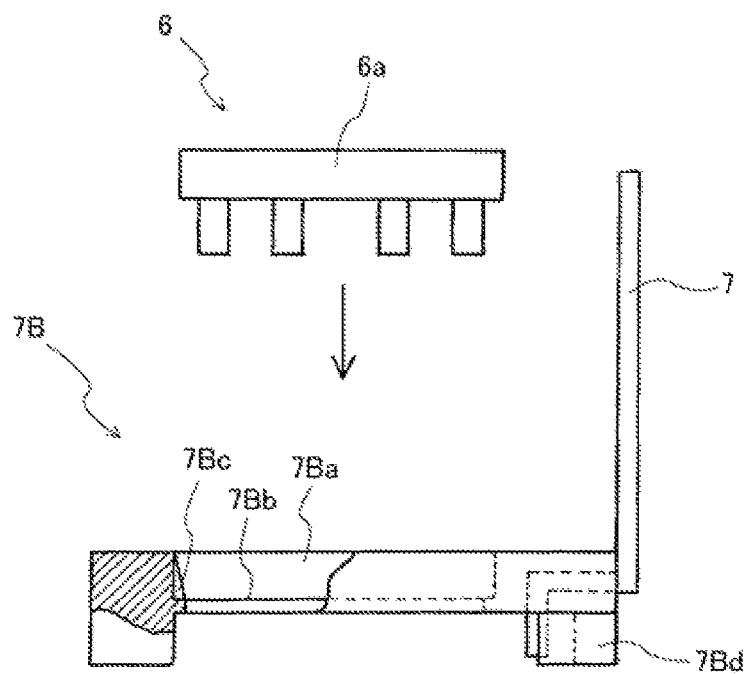

FIG. 12(a) is a plan view illustrating a lead pin block 7B used in the semiconductor device component according to this embodiment and FIG. 12(b) is a side surface illustrating the lead pin block 7B. The lead pin block 7B illustrated in FIGS. 12(a), 12(b) has a rectangular shape in a plan view. A plurality of lead pins 7 is integrally attached along one side of the lead pin block 7B and then fixed. An opening 7Ba for accommodating the radiation block 6 is formed at the center of the lead pin block 7B. The opening 7Ba passes through the lead pin block 7B in a thickness direction. The size of the opening 7Ba is slightly larger than the upper surface of the radiation block 6 on the upper surface side of the lead pin block 7B and is slightly less than the upper surface of the radiation block 6 on the lower surface side of the radiation block 6. A step 7Bb which is locked to the base portion 6a of the radiation block 6 is provided between the upper and lower ends of the opening 7Ba. In addition, protrusions 7Bc are formed on the inner surface of the opening 7Ba. The protrusion 7Bc protrudes from the inner surface of the opening 7Ba and gradually increases from the upper end of the opening 7Ba to the step 7Bb.

Legs 7Bd are formed at four corners of the lower end of the lead pin block 7B. As represented by a dashed line in FIG. 12(a), each of the four legs 7Bd has a shape in which one corner that is closer to the center of the lead pin block 7B among four corners of a rectangle is cut out. The cutout portion of the leg 7Bd has a size and shape that are fitted to four corners of the semiconductor chip 3.

One end of the lead pin 7 extends upward from the side surface of the lead pin block 7B. The lead pin 7 is bent in the lead pin block 7B and the other end of the lead pin 7 extends downward to substantially the same length as that of the leg 7Bd. The lead pin 7 which extends downward is bonded to an electrode (for example, a gate electrode) formed on the upper surface of the semiconductor chip 3 by solder. The lead pin block 7B is made of, for example, a PPS resin which is an insulating and heat-resistant resin. The lead pins 7 are formed integrally with the lead pin block 7B by, for example, injection molding.

The radiation block 6 is attached to the opening 7Ba of the lead pin block 7B and the lead pin block 7B and the radiation block 6 are integrated. The radiation block is not limited to the radiation block 6 illustrated in FIGS. 1(a), 1(b). For example, any of the radiation blocks 61 to 67 illustrated in FIGS. 2(a) to 5 may be used. When the radiation block 6 is fitted to the lead pin block 7B illustrated in FIG. 12(b) by pressure, the base portion 6a of the radiation block 6 is locked to the step 7Bb formed in the opening 7Ba, and the side surface of the base portion 6a of the radiation block 6 is pressed against the protrusions 7Bc formed on the inner surface of the opening 7Ba. In this way, the radiation block 6 is fixed to the lead pin block 7B. When the radiation block 6 is fixed to the lead pin block 7B, the upper surface of the radiation block 6 is positioned in the same plane as the upper surface of the lead pin block 7B, but protrudes upward from the upper surface of the lead pin block 7B. Therefore, the radiation block 6 can be easily bonded to the conductive plate.

The integrated structure of the radiation block 6 and the lead pin block 7B is not limited to the structure illustrated in FIGS. 12(a), 12(b). For example, the radiation block 6 and the lead block may be integrally formed by, for example, injection molding. When the radiation block 6 and the lead block are integrally molded, the step 7Bb or the protrusion 7Bc illustrated in FIGS. 12(a), 12(b) is not necessarily provided.

Figure 13:
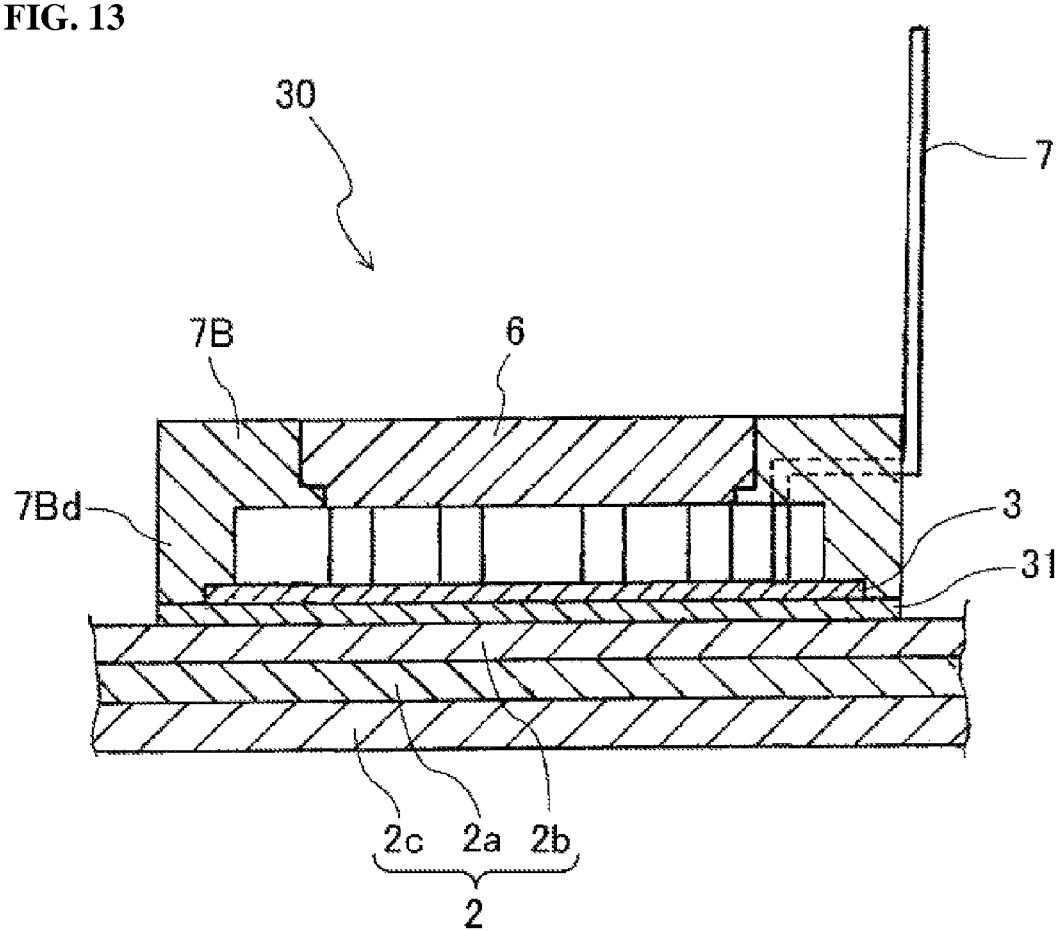
FIG. 13 is a cross-sectional view illustrating a main portion of the semiconductor device component using the lead pin block illustrated in FIGS. 12(a), 12(b)

FIG. 13 is a cross-sectional view illustrating a main portion of a semiconductor device component 30 according to this embodiment including the radiation block 6 and the lead pin block 7B which are integrated. The insulating substrate 2 includes an insulating plate 2a and metal films 2b and 2c. A metal plate 31 which has a rectangular shape in a plan view is soldered to the metal film 2b of the insulating substrate 2. The metal plate 31 has a larger size than the semiconductor chip 3 in a plan view and is provided to improve the radiation performance. However, the metal plate 31 is not an indispensable member in this embodiment. The metal plate 31 may not be provided and the semiconductor chip 3 may be soldered to the metal film 2b. When the semiconductor chip 3 is soldered to the metal plate 31, electrodes (for example, a collector electrode and a cathode electrode of an RC-IGBT chip) formed on the lower surface of the semiconductor chip are electrically connected to the metal plate 31 and the metal film 2b. One electrode (for example, a gate electrode of the RC-IGBT chip) among the electrodes formed on the upper surface of the semiconductor chip 3 is soldered to the lower end of the lead pin 7 fixed to the lead pin block 7B. In addition, another electrode (for example, an emitter electrode or an anode electrode of the RC-IGBT chip) among the electrodes formed on the upper surface of the semiconductor chip 3 is soldered to the pins of the radiation block 6.

In the semiconductor device component 30 according to this embodiment, the effect of the radiation block 6 is the same as that in the above-described embodiments. In the semiconductor device component 30 according to this embodiment, the lead pin block 7B and the radiation block 6 are integrated and the lead pins fixed to the lead pin block 7B are soldered to the electrodes formed on the upper surface of the semiconductor chip 3. Therefore, it is not necessary to electrically connect the region 2bb of the metal film 2b to the electrodes formed on the upper surface of the semiconductor chip 3 using the bonding wires 5 made of, for example, aluminum, unlike the semiconductor device component 1 illustrated in FIGS. 6(a), 6(b). Therefore, it is possible to reduce the size of the semiconductor device component.

The cutout portion of each of the legs 7Bd which are formed at four corners of the lower surface of the lead pin block 7B has a size and shape which is fitted to four corners of the semiconductor chip 3. Therefore, the semiconductor chip 3 and the radiation block 6 or the lead pins 7 fixed to the lead pin block 7B are positioned only by fitting the legs 7Bd of the lead pin block 7B to four corners of the semiconductor chip 3. Therefore, it is possible to easily perform positioning with high accuracy.

In addition, the thickness of the solder between the semiconductor chip 3 and the metal plate 31 can be restricted by the height of the cutout portions formed in the legs 7Bd of the lead pin block 7B. The thickness of the solder applied between the semiconductor chip 3 and the radiation block 6 can be restricted by the difference between the height of the leg 7Bd and the height of the pin of the radiation block 6. Therefore, it is possible to adjust the thickness of the solder.

The lead pin block 7B may be structured such that the cutout portion is not provided in the leg 7Bd. In this case, the lead pin block 7B is positioned by another means. In this structure, both the thickness of the solder between the semiconductor chip 3 and the metal plate 31 and the thickness of the solder applied between the semiconductor chip 3 and the radiation block 6 can be restricted by the difference (for example, about 0.2 mm to 0.4 mm) between the height of the leg 7Bd and the height of the pin of the radiation block 6.

As illustrated in FIGS. 12(a), 12(b), when the radiation block 6 is fitted to the lead pin block 7B by pressure, the radiation block 6 attached to the lead pin block 7B can be replaced with other types of radiation blocks, for example, the radiation blocks 61 to 67 illustrated in FIGS. 2(a) to 5.

Embodiment 15

Figure 14:
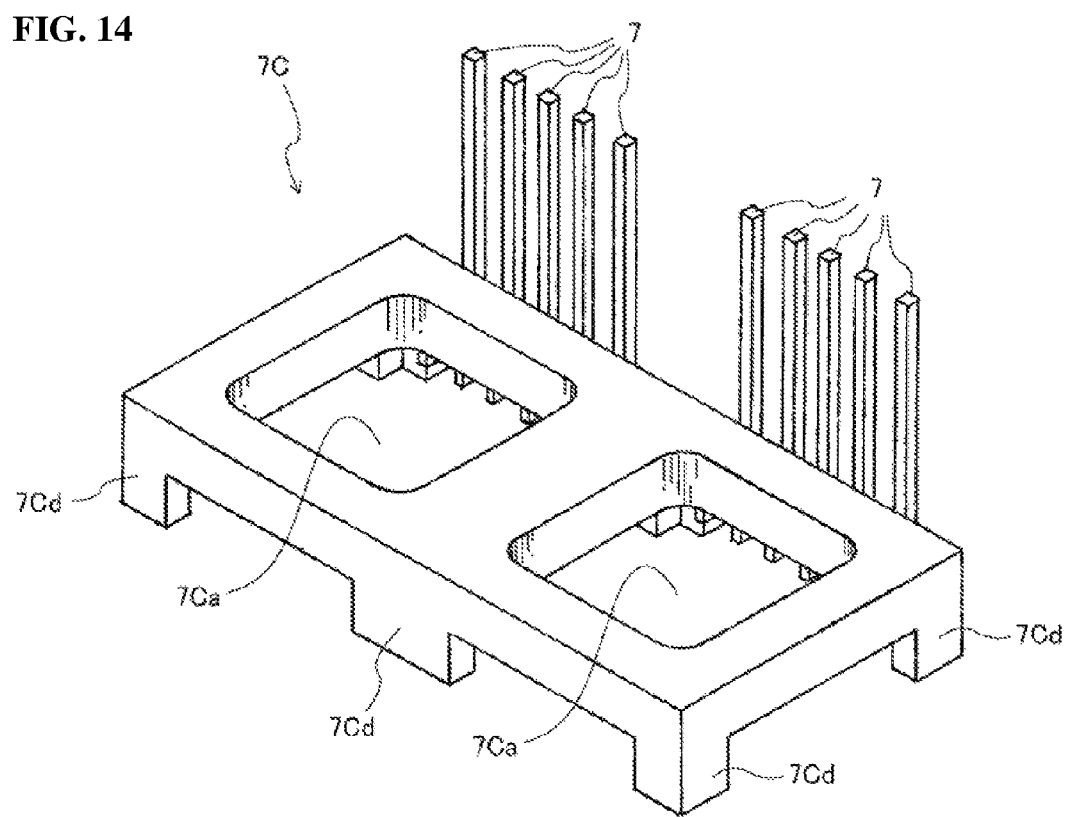
FIG. 14 is a perspective view illustrating another lead pin block.

The lead pin block is not limited to the structure illustrated in FIGS. 12(a), 12(b) to which one radiation block 6 is fixed. For example, a lead pin block may have a structure to which two or three or more radiation blocks 6 are fixed. FIG. 14 is a perspective view illustrating a lead pin block 7C to which two radiation blocks 6 are fixed and which is integrated with the two radiation blocks 6. The lead pin block 7C illustrated in FIG. 14 has a substantially rectangular shape in a plan view and includes two openings 7Ca for accommodating the radiation blocks 6. The opening 7Ca passes through the lead pin block 7C in a thickness direction, similarly to the opening 7Ba of the lead pin block 7B illustrated in FIGS. 12(a), 12(b). A plurality of lead pins 7 corresponding to each opening is attached to one side surface of the lead pin block 7C so as to be integrated with the lead pin block 7C. A plurality of legs 7Cd is formed on the lower surface of the lead pin block 7C.

The lead pin block 7C can be fixed to the radiation block 6 by the same method as that used for the lead pin block 7B illustrated in FIGS. 12(a), 12(b). Specifically, the lead pin block 7C may be fixed by press fitting or integral molding. Therefore, fixing means is not illustrated in FIGS. 12(a), 12(b).

Figure 15A:
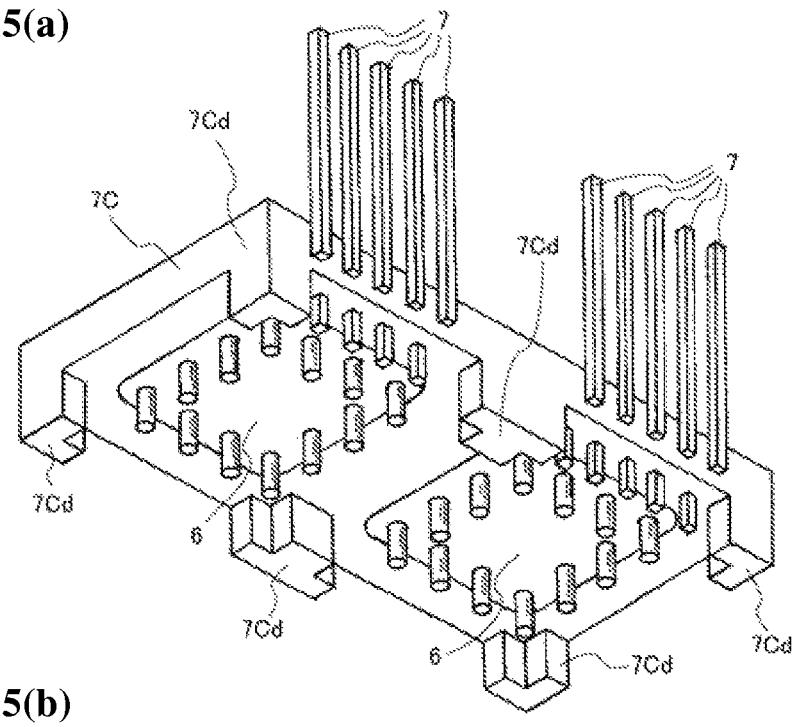
FIGS. 15(a), 15(b) are perspective views illustrating a structure including a radiation block and the lead pin block illustrated in FIG. 14.
Figure 15B:
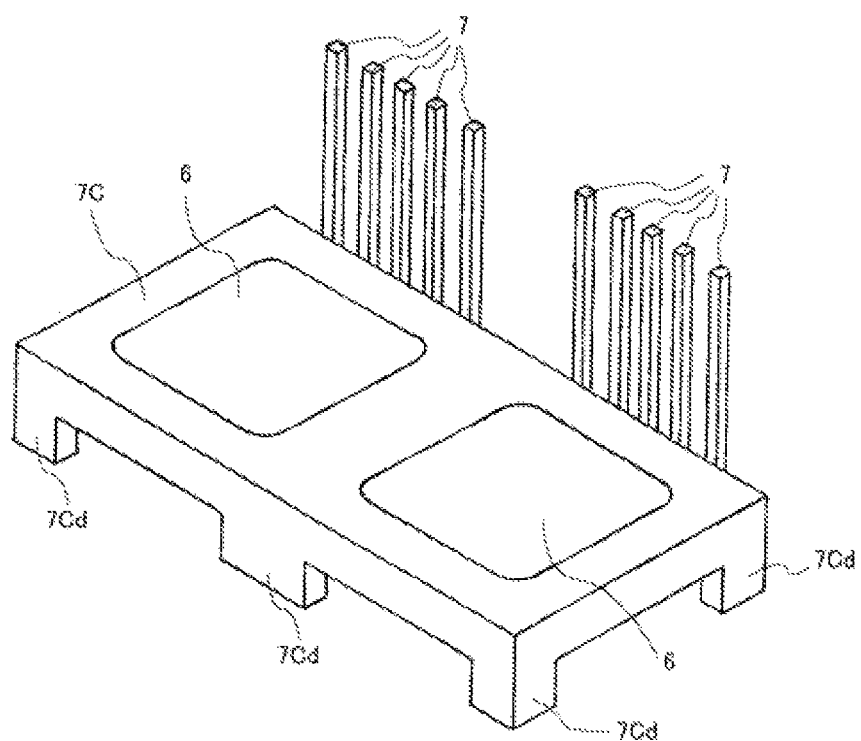

FIG. 15(a) is a perspective view illustrating the structure in which the radiation blocks 6 are integrally attached to the lead pin block 7C as obliquely viewed from the bottom and FIG. 15(b) is a perspective view illustrating the structure as obliquely viewed from the top. The lead pin block 7C illustrated in FIGS. 14 and 15(a), 15(b) differs from the lead pin block 7B illustrated in FIGS. 12(a), 12(b) in the number of radiation blocks 6 fixed, but has the same function and effect the lead pin block.

Semiconductor chips 3 which are bonded to the two radiation blocks 6 integrally attached to the lead pin block 7C are the same type. The two semiconductor chips can be connected in parallel to each other. The semiconductor chip 3 is, for example, an IGBT chip or a MOSFET chip. A reverse conducting IGBT (RC-IGBT) chip may be used as the semiconductor chip 3. The parallel connection of the same type of two semiconductor chips makes it possible to increase the capacity of a semiconductor module when a semiconductor device component 40, which will be described below, is used in the power semiconductor module. However, the semiconductor chips 3 bonded to the two radiation blocks are not limited to the same type of semiconductor chips, and may be different types of semiconductor chips. For example, one semiconductor chip may be an IGBT chip and the other semiconductor chip may be a diode chip (FWD chip).

Figure 16A:
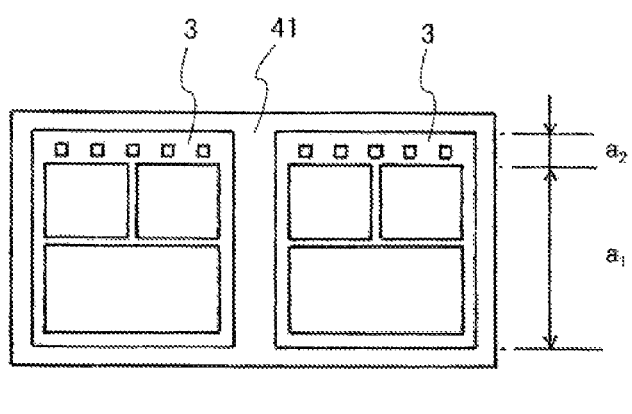
FIG. 16(a) is a plan view illustrating a state in which a semiconductor chip is attached to a metal plate.
Figure 16B:
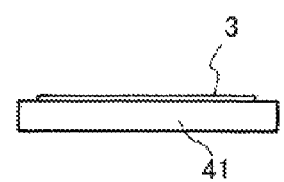
FIG. 16(b) is a side view thereof.
Figure 17:
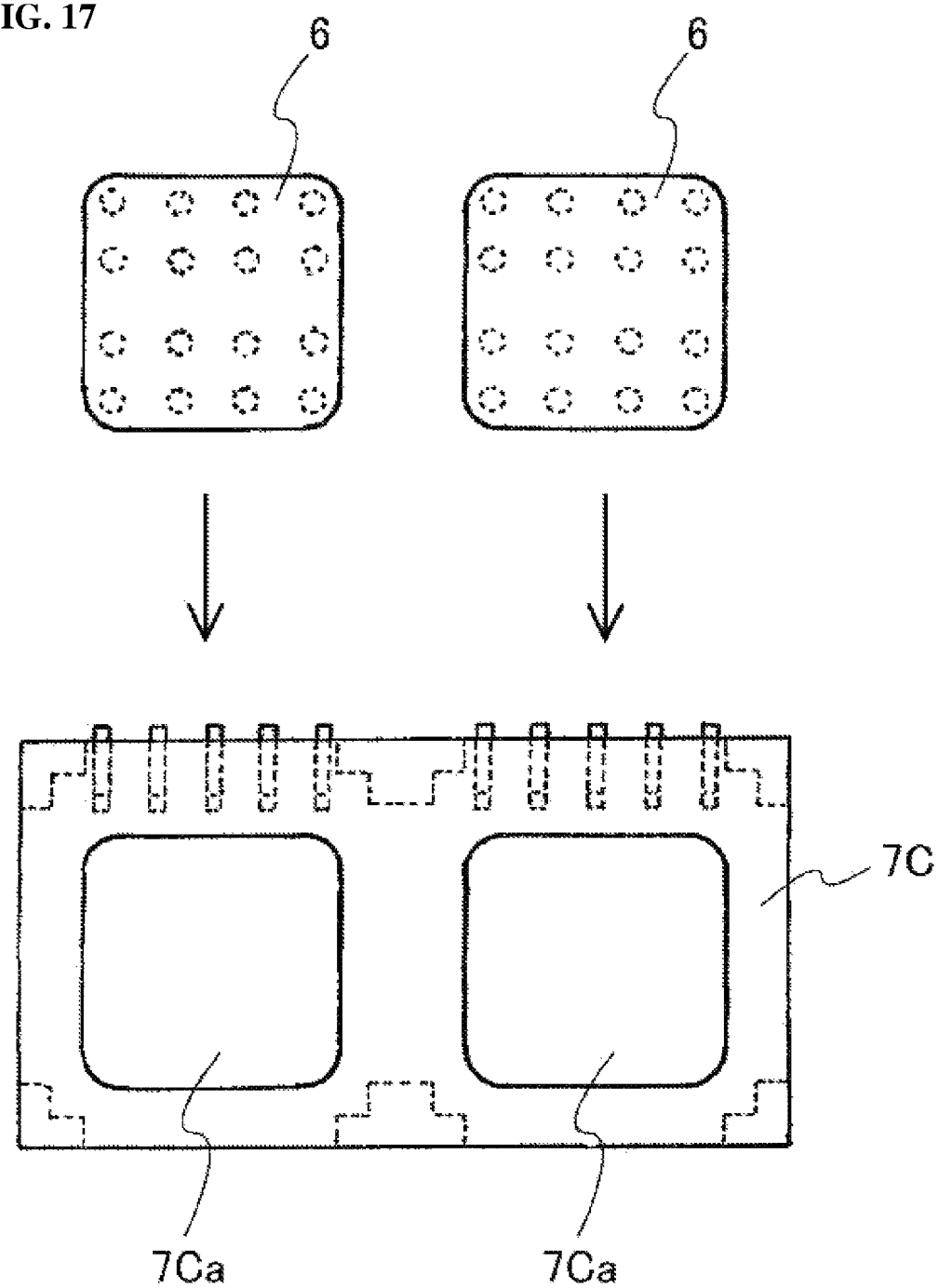
FIG. 17 is a plan view illustrating the lead pin block and the radiation block.
Figure 18A:
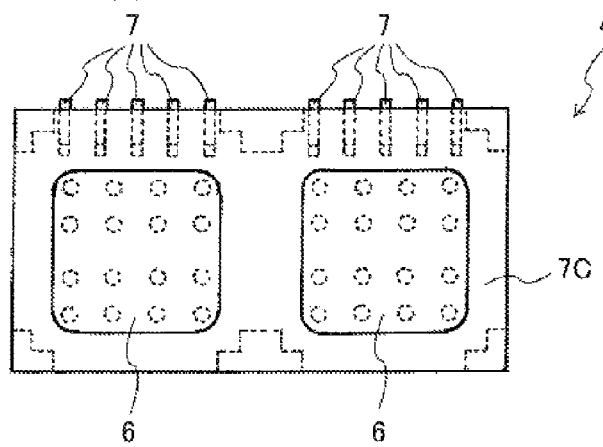
FIG. 18(a) is a plan view illustrating the structure including the lead pin block and the radiation block.
Figure 18B:
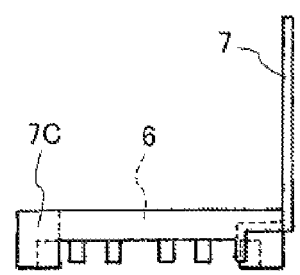
FIG. 18(b) is a side view thereof.

The semiconductor device component 40 using the lead pin block 7C and an assembly process of the semiconductor device component 40 will be described with reference to FIGS. 16(a) to 19(b). First, an insulating substrate, a metal plate 41, and semiconductor chips 3 are prepared. The metal plate 41 is used to improve the radiation performance and is not an indispensable member. As illustrated in the plan view of FIG. 16(a) and the side view of FIG. 16(b), the semiconductor chip 3 is placed at a predetermined position on the metal plate 41 through solder (not illustrated). For example, the semiconductor chip 3 is an RC-IGBT chip. In FIGS. 16(a) and 16(b), the insulating substrate bonded to the metal plate 41 is not illustrated. Then, as illustrated in the plan view of FIG. 17, two radiation blocks 6 are attached to the openings 7Ca of the lead pin block 7C. In this way, as illustrated in the plan view of FIG. 18(a) and the side view of FIG. 18(b), a structure 42 in which the radiation blocks 6 are integrally attached to the lead pin block 7C is obtained.

Figure 19A:
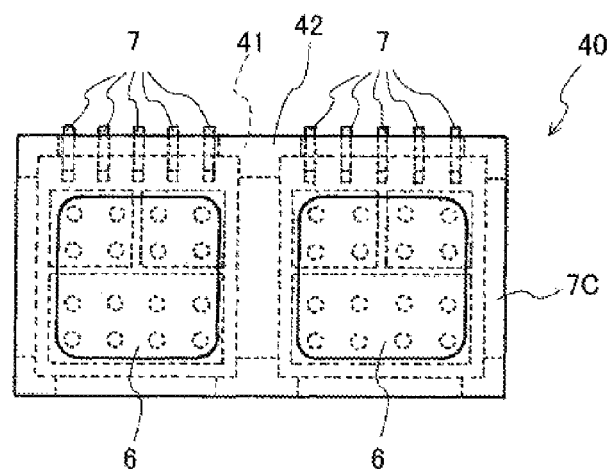
FIG. 19(a) is a plan view illustrating a semiconductor device component according to another embodiment of the invention.
Figure 19B:
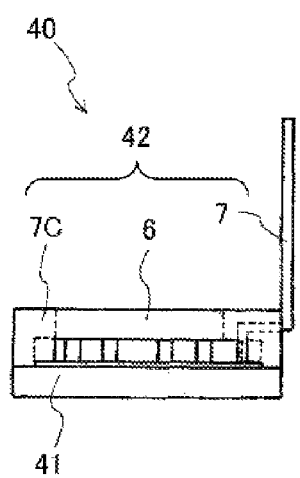
FIG. 19(b) is a side view thereof.

Then, as illustrated in FIGS. 19(a), 19(b), the semiconductor chip 3 on the metal plate 41 and the radiation block 6 and the lead pins which are fixed to the lead pin block 7C are positioned such that the leading ends of the pins of the radiation portion 6b of the radiation block 6 in the structure 42 are connected to a region a1 (see FIGS. 16(a), 16(b)), in which an emitter electrode and an anode electrode are provided, on the upper surface of the semiconductor chip 3 on the metal plate 41 by solder and the lower ends of the lead pins 7 fixed to the lead pin block 7C in the structure 42 are connected to a region a2 (see FIGS. 16(a), 16(b)), in which a gate electrode is provided, in the semiconductor chip 3 on the metal plate 41 by solder. As described above, this positioning process can be performed by fitting the cutout portions of the legs 7Cd of the lead pin block 7C to four corners of the semiconductor chip 3 which has a rectangular shape in a plan view. After the positioning process is performed, heat is performed in a heating furnace to melt the solder between the metal plate 41 and the semiconductor chip 3 and the solder between the semiconductor chip 3 and the radiation block 6 or the lead pins. Then, cooling is performed to solder the metal plate 41 and the semiconductor chip 3, to solder the semiconductor chip 3 and the radiation block 6, and to solder the semiconductor chip 3 and the lead pins 7. The semiconductor device component 40 illustrated in FIGS. 19(a), 19(b) is obtained by the above-mentioned assembly process.

Embodiment 16

Figure 20:
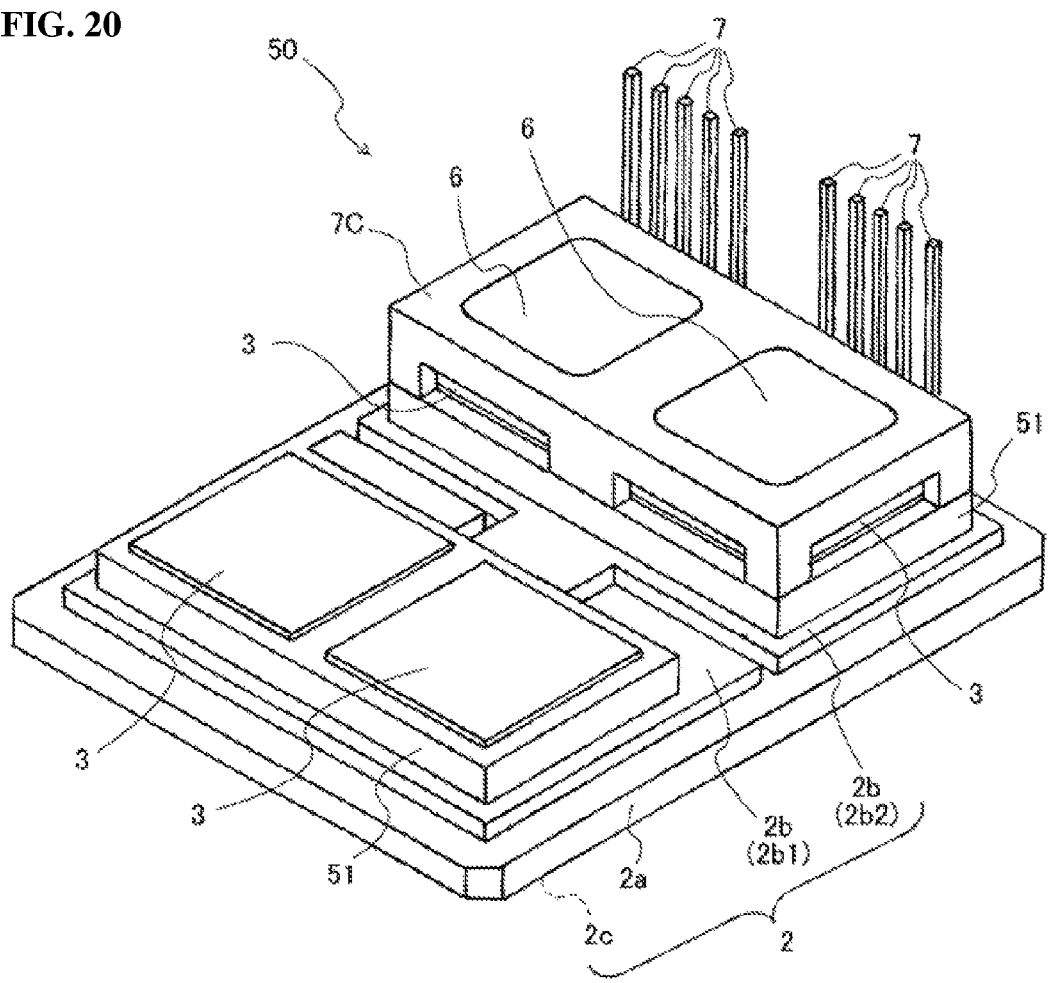
FIG. 20 is a perspective view illustrating a semiconductor device component according to another embodiment of the invention.

FIG. 20 is a perspective view illustrating another embodiment of the semiconductor device component using the lead pin block 7C. In a semiconductor device component 50 illustrated in FIG. 20, four semiconductor chips 3 are mounted on one insulating substrate 2 through a metal plate 51 which is provided in order to improve the radiation performance. In this embodiment, each semiconductor chip 3 is a reverse conducting IGBT (RC-IGBT) chip. The four semiconductor chips form two sets, each of which includes two semiconductor chips that are connected in parallel to each other in order to increase the capacity of a power semiconductor module. In the case of an inverter apparatus, the two sets of the semiconductor chips form the upper and lower arms of the power semiconductor module. A circuit pattern for forming the upper and lower arms is formed on a metal film 2b which is electrically connected to electrodes (for example, a collector electrode and a cathode electrode of the RC-IGBT chip) formed on the lower surface of each semiconductor chip 3 through a metal plate 51.

The lead pin blocks 7C are provided on the two sets of the semiconductor chips 3 which are connected in parallel to each other. In FIG. 20, for ease of understanding of the semiconductor device component 50 according to this embodiment, the lead pin block 7C on one set of the semiconductor chips 3 which is illustrated on the back side of the plane of paper among the two sets of the semiconductor chip 3 is illustrated. However, the lead pin block 7C is also provided on one set of the semiconductor chips 3 which is illustrated on the front side of the plane of paper.

The two radiation blocks 6 are integrally attached to the lead pin block 7C. In addition, a plurality of lead pins 7 is fixed to the lead pin block 7C. The pins which are formed on the lower surface of the radiation block 6 is soldered to one electrode (for example, the emitter electrode and the anode electrode) formed on the upper surface of the semiconductor chip 3. The lower end of the lead pin 7 is soldered to the other electrode (for example, the gate electrode) formed on the upper surface of the semiconductor chip 3. The structure of the lead pin block 7C and the radiation block 6 is the same as that in the above-described embodiments.

The radiation block 6 and the lead pin block 7C in the semiconductor device component 50 according to this embodiment have the same effect as those in the above-described embodiments.

Embodiment 17

One or more semiconductor device components 30 according to Embodiment 14, one or more semiconductor device components 40 according to Embodiment 15, or one or more semiconductor device components 50 according to Embodiment 16 can be provided as the unit modules on the metal substrate to a form power semiconductor module. When the semiconductor device component 30, 40, or 50 is used as the unit module, the same frame as the frame 8 of the unit module 10 illustrated in FIGS. 6(c), 6(d) may be provided in the periphery of the insulating substrate of each semiconductor device component so as to be bonded and fixed to the insulating substrate and the frame may be filled with the same sealing material as described above.

Figure 21:
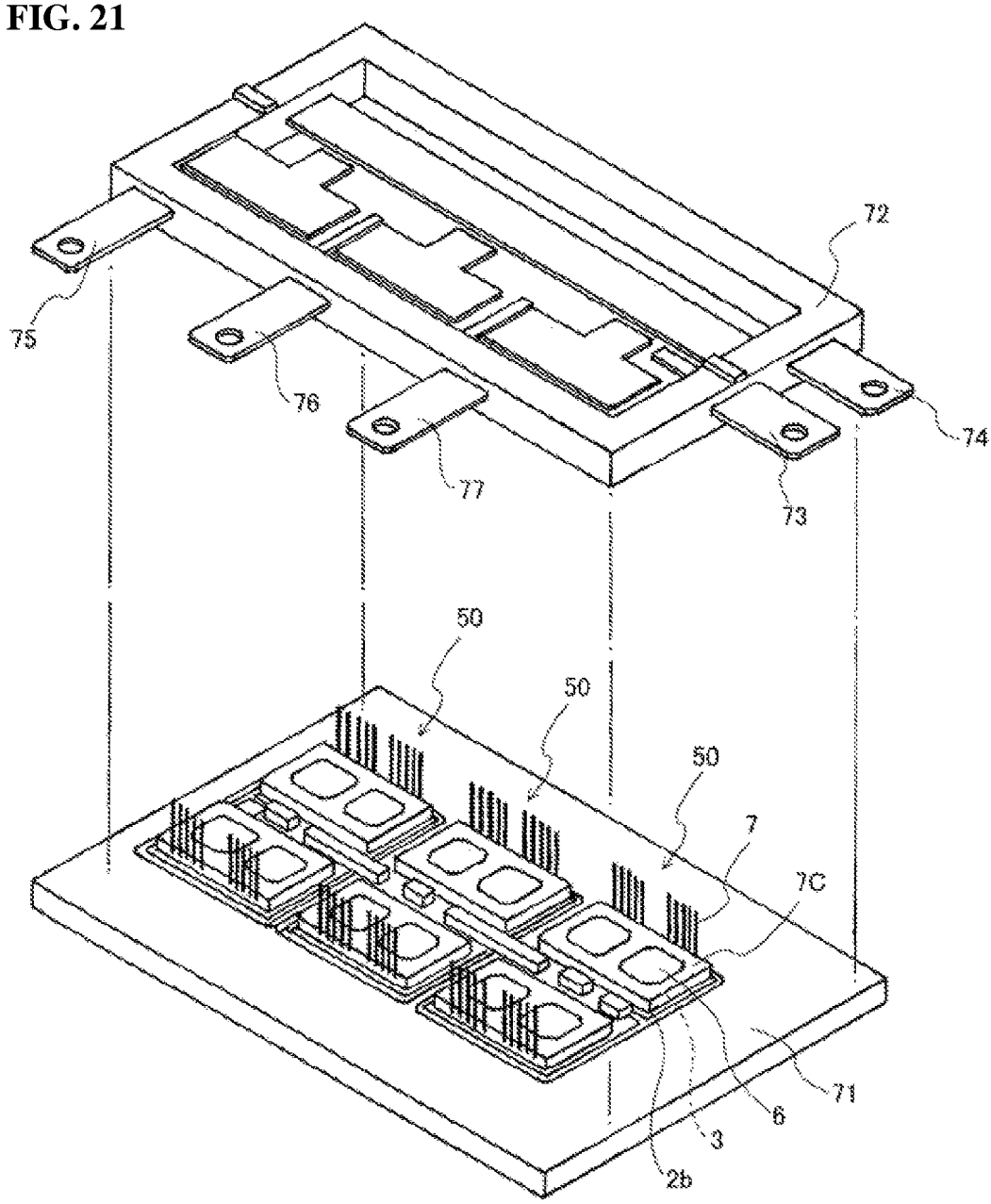
FIG. 21 is a perspective view illustrating a process of assembling a power semiconductor module according to another embodiment of the invention.

A power semiconductor module 70 which uses the semiconductor device component 50 illustrated in FIG. 20 as the unit module will be described in the order of the assembly process of the power semiconductor module 70 with reference to FIGS. 21, 23, and 24.

First, as illustrated in the perspective view of FIG. 21, three semiconductor device components 50 are arranged as the unit modules on a metal substrate 71 such that two semiconductor chips 3 which form a set and are provided below the lead pin block 7C are arranged in a line in each semiconductor device component 50 and are fixed to the metal substrate 71 by solder. In each semiconductor device component 50, a circuit pattern of a metal film 2b is formed so as to form the upper and lower arms of an inverter circuit. The power semiconductor module 70 according to this embodiment in which three semiconductor device components 50 are connected to each other is a so-called 6-in-1 power semiconductor module forming a three-phase inverter circuit.

Figure 22:
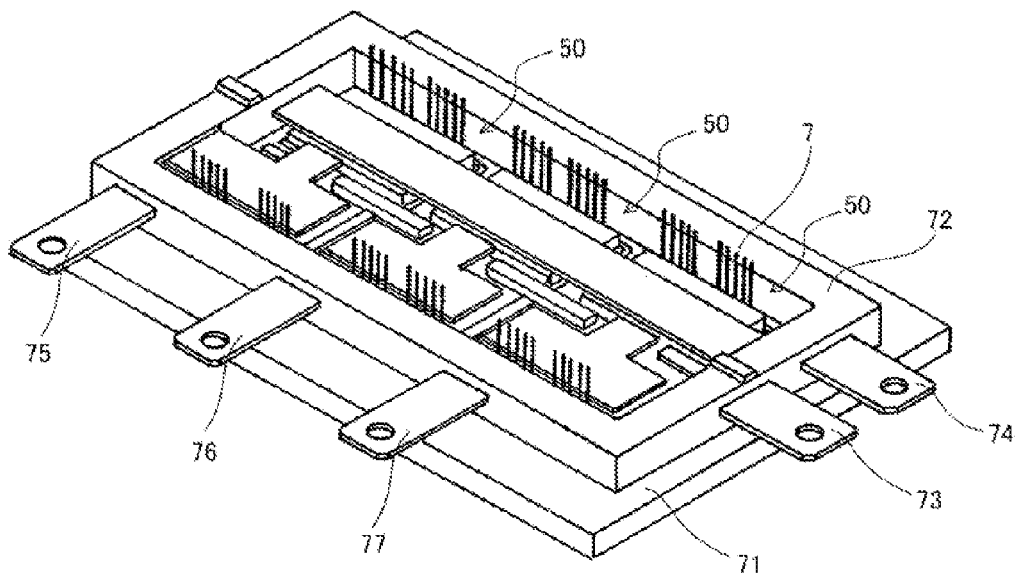
FIG. 22 is a plan view illustrating a main portion of a circuit for connecting a semiconductor device component used in the power semiconductor module illustrated in FIG. 21.

FIG. 22 is a plan view illustrating a circuit for connecting the semiconductor device components 50 in the power semiconductor module 70. The metal film 2b of the insulating substrate 2 of each semiconductor device component 50 is divided into a region 2b1 which is connected to the electrodes formed on the lower surfaces of one set of two semiconductor chips 3 forming the upper arm and a region 2b2 which is connected to the electrodes formed on the lower surfaces of one set of two semiconductor chips 3 forming the lower arm. A bus bar 78 and an electrode block 791 are provided in the region 2b1 which is formed close to a side end between two lead pin blocks 7C in each semiconductor device component 50. The bus bar 78 is formed so as to be laid across the regions 2b1 of adjacent semiconductor device components 50 and electrically connects the regions 2b1. The electrode block 791 is connected to a P terminal which will be described below. In addition, a feed block 792 is provided in the region 2b2 which is formed close to the center between two lead pin blocks 7C in each semiconductor device component 50. The feed block 792 is welded to conductive plates forming a U terminal 75, a V terminal 76, and a W terminal 77 that are formed in a case 72 of the power semiconductor module 70 and is electrically connected to the conductive plates, which will be described below.

The case 72 which accommodates the semiconductor device components 50 fixed to the metal substrate 71 is separately prepared. For example, in the case 72 illustrated in FIG. 21, a P terminal 73, an N terminal 74, the U terminal 75, the V terminal 76, and the W terminal 77 are integrally formed. Each terminal also functions as a conductive plate which extends to the internal space of the case 72. When the case 72 is made of a resin, the terminals are integrated with the case 72 by, for example, injection molding.

Figure 23:
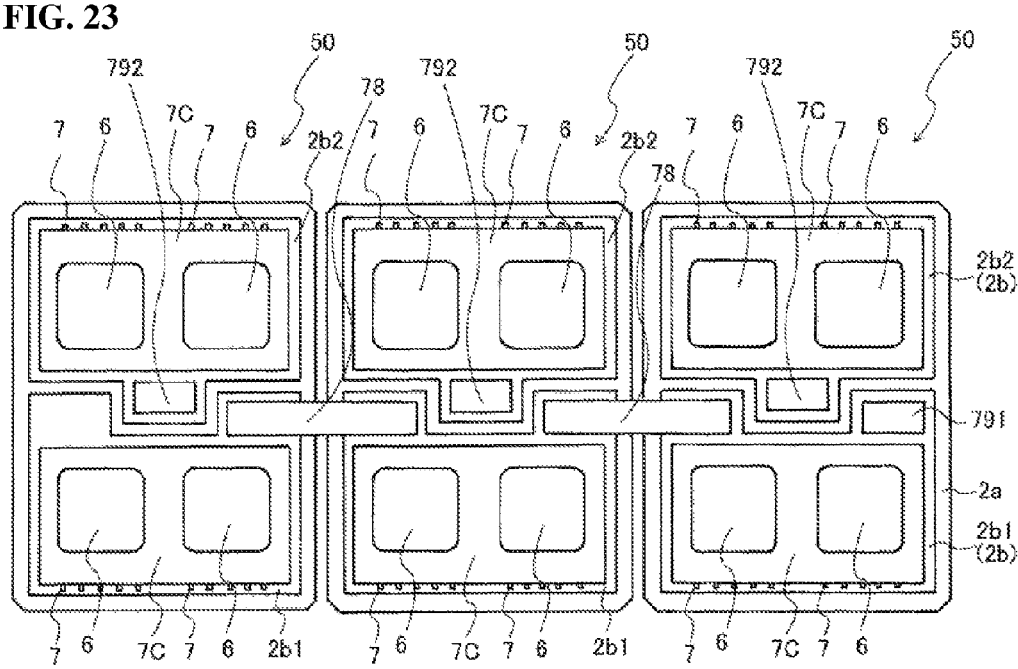
FIG. 23 is a perspective view illustrating the process of assembling the power semiconductor module.

Then, as illustrated in FIG. 23, the metal substrate 71 is fixed to the case 72 by an adhesive. In addition, the radiation blocks 6, the electrode block 791, and the feed block 792 of each semiconductor device component 50 fixed to the metal substrate 71 and the conductive plates which are formed in the case 72 and function as the terminals are bonded and electrically connected to each other such that a three-phase inverter circuit is formed. This bonding process is preferably performed by laser welding.

It is preferable to inject a sealing material into the case 72 to a height that is not affected by the laser welding in order to protect, for example, the semiconductor chip 3 from sputters during the laser welding. The sealing material is gel or resin with high heat resistance and/or high fluidity, such as silicon gel or epoxy resin.

Figure 24:
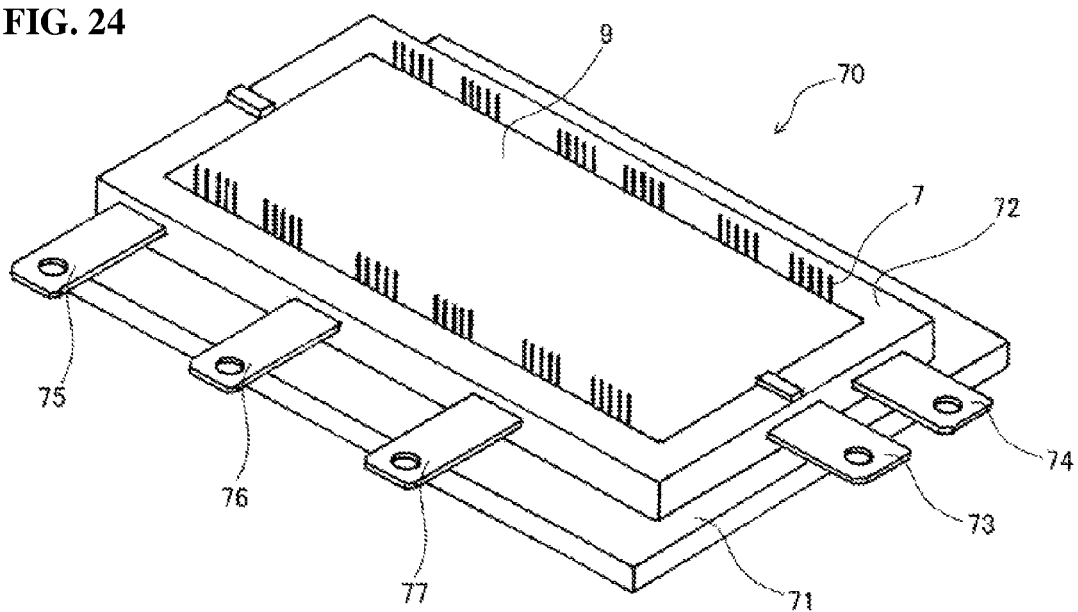
FIG. 24 is a perspective view illustrating the process of assembling the power semiconductor module.

After the laser welding, the case is filled with a sealing material 9, as illustrated in FIG. 24. The sealing material which fills the case after the laser welding may be the same type as the sealing material which is injected into the case before the laser welding. In addition, an inexpensive sealing material may be used. When the inexpensive sealing material is used, the sealing material with high heat resistance and low costs can be used for the power semiconductor module 70.

In the power semiconductor module 70 obtained by the above-mentioned assembly process, since the semiconductor device component 50 is used as the unit module, it is possible to freely adjust the distance between the chips on the metal substrate 71 and thus to reduce thermal interference between the chips. In addition, since the sealing material is injected before the laser welding, the semiconductor chip 3 is protected from sputters during the laser welding.

When the unit module is used in the power semiconductor module, the number or combination of unit modules can be adjusted to manufacture various power semiconductor modules. In addition, when a case having a shape and terminals corresponding to each power semiconductor module is prepared, it is possible to manufacture the power semiconductor module with ease. Furthermore, when the same unit modules are connected in parallel to each other on the metal substrate 71, it is possible to increase the capacity of the power semiconductor module.

Embodiment 18

Figure 25:
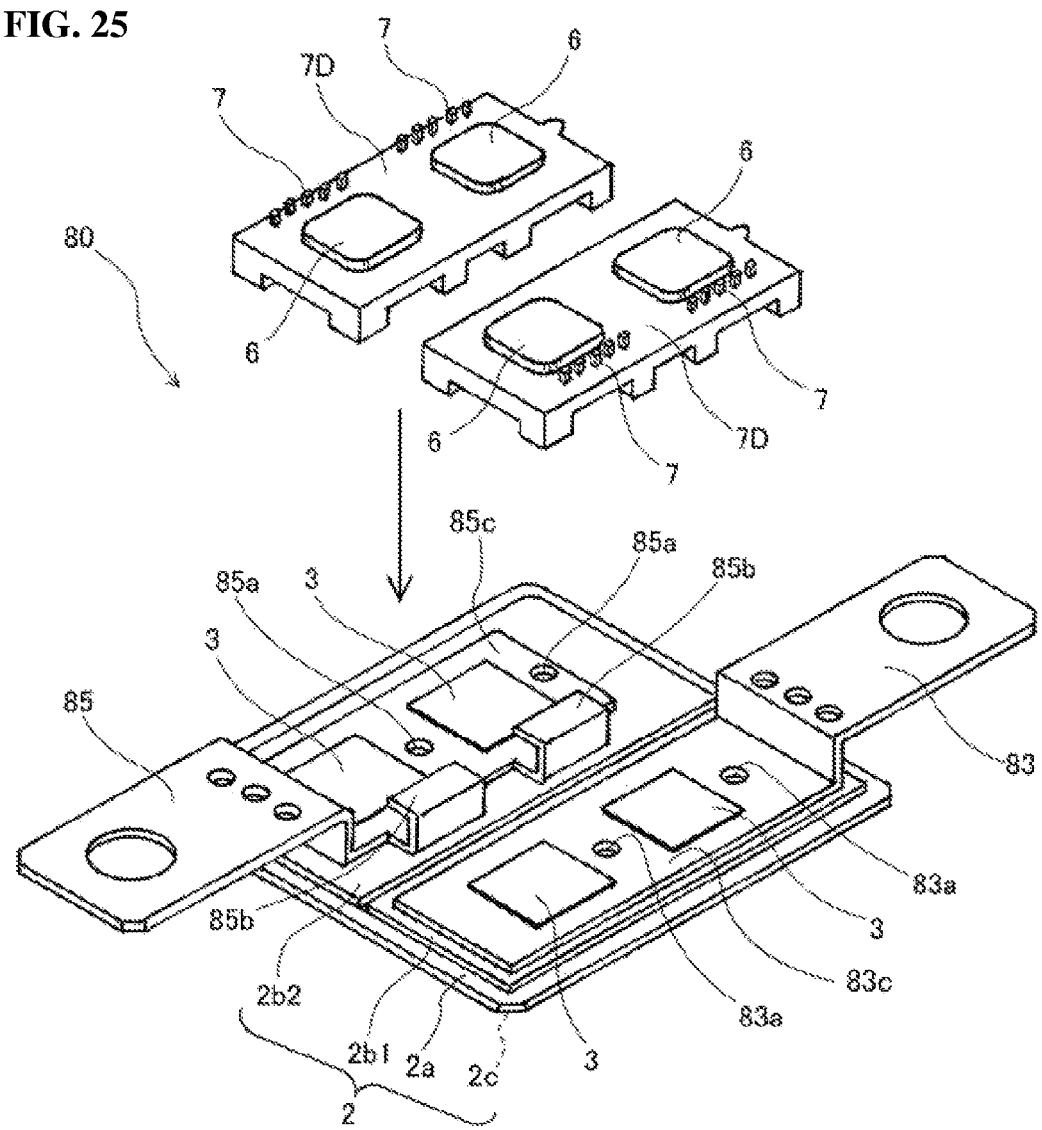
FIG. 25 is an exploded perspective view illustrating a semiconductor device component according to another embodiment of the invention.

Next, another embodiment of the semiconductor device component and the power semiconductor module will be described. A semiconductor device component 80 according to this embodiment is suitable to assemble a 2-in-1 power semiconductor module. FIG. 25 is an exploded perspective view illustrating the semiconductor device component 80 according to this embodiment in which an insulating substrate 2 includes an insulating plate 2a, a metal film 2b which is bonded to one surface of the insulating plate 2a, and a metal film 2c which is bonded to the other surface of the insulating plate 2a. In the exploded perspective view of FIG. 25, the metal film 2c is not illustrated. The metal film 2b is divided into a region 2b1 and a region 2b2.

A terminal 83 including a metal plate portion 83c is soldered to the region 2b1 of the metal film 2b. Holes 83a for positioning a lead pin block 7D, which will be described below, are formed in the surface of the metal plate portion 83c of the terminal 83. The hole 83a passes through the terminal 83 in a thickness direction. However, the hole 83a may not necessarily pass through the terminal 83. That is, the hole 83a may be a concave portion which is provided in the surface of the terminal 83.

A terminal 85 including a metal plate portion 85c is soldered to the region 2b2 of the metal film 2b. Holes 85a for positioning the lead pin block 7D, which will be described below, are formed in the surface of the metal plate portion 85c of the terminal 85. The hole 85a passes through the terminal 85 in a thickness direction. However, the hole 85a may not necessarily pass through the terminal 85. That is, the hole 85a may be a concave portion which is provided in the surface of the terminal 85. A feed portion 85b is provided in a portion of the terminal 85 corresponding to the metal plate, that is, the metal plate portion 85c. The feed portion 85b is formed by partially bending the terminal 85 in a box shape.

Semiconductor chips 3 are soldered to the metal plate portion 83c of the terminal 83 which is bonded to the region 2b1 of the metal film 2b. In this embodiment illustrated in FIG. 25, two semiconductor chips 3 are provided in the longitudinal direction of the terminal 83. An RC-IGBT chip is used as an example of the semiconductor chip 3. Since two RC-IGBT chips of the same type are provided in parallel, it is possible to increase the capacity of the power semiconductor module. The metal plate portion 83c of the terminal 83 is electrically connected to an electrode which is formed on the lower surface of the semiconductor chip 3 and functions as a heat spreader to improve the radiation performance of the semiconductor chip 3.

Similarly to the terminal 83, two semiconductor chips 3 are provided in parallel in the longitudinal direction of the terminal 85 which is bonded to the region 2b2 of the metal film 2b and are soldered to the terminal 85. An RC-IGBT chip is used as an example of the semiconductor chip 3. Since two RC-IGBT chips of the same type are provided in parallel, it is possible to increase the capacity of the power semiconductor module. The metal plate portion 85c of the terminal 85 is electrically connected to an electrode which is formed on the lower surface of the semiconductor chip 3 and functions as a heat spreader to improve the radiation performance of the semiconductor chip 3.

Radiation blocks 6 are attached to each of the two semiconductor chips 3 provided on the terminal 83. The two radiation blocks 6 are integrated with the lead pin block 7D to which a plurality of lead pins 7 are fixed, are attached to the terminal 83 together with the lead pin block 7D, and are soldered to the semiconductor chips 3.

Radiation blocks 6 are attached to each of the two semiconductor chips 3 provided on the terminal 85, similarly to the terminal 83. The two radiation blocks 6 are integrated with the lead pin block 7D to which a plurality of lead pins 7 are fixed, are attached to the terminal 85 together with the lead pin block 7D, and are soldered to the semiconductor chips 3.

The lead pin blocks 7D attached to the terminals 83 and 85 have a shape close to the shape of the lead pin block 7C illustrated in FIG. 14. The lead pin block 7D differs from the lead pin block 7C in that the lead pin 7 extends upward from the vicinity of a portion, to which the radiation block 6 is attached, in order to reduce the size of the lead pin block 7D, and a protrusion 7De (see FIGS. 25 and 26) having a length longer than that of the leg 7Cd of the lead pin block 7C protrudes from the rear surface in order to position the terminal 83 or the terminal 85.

Figure 26:
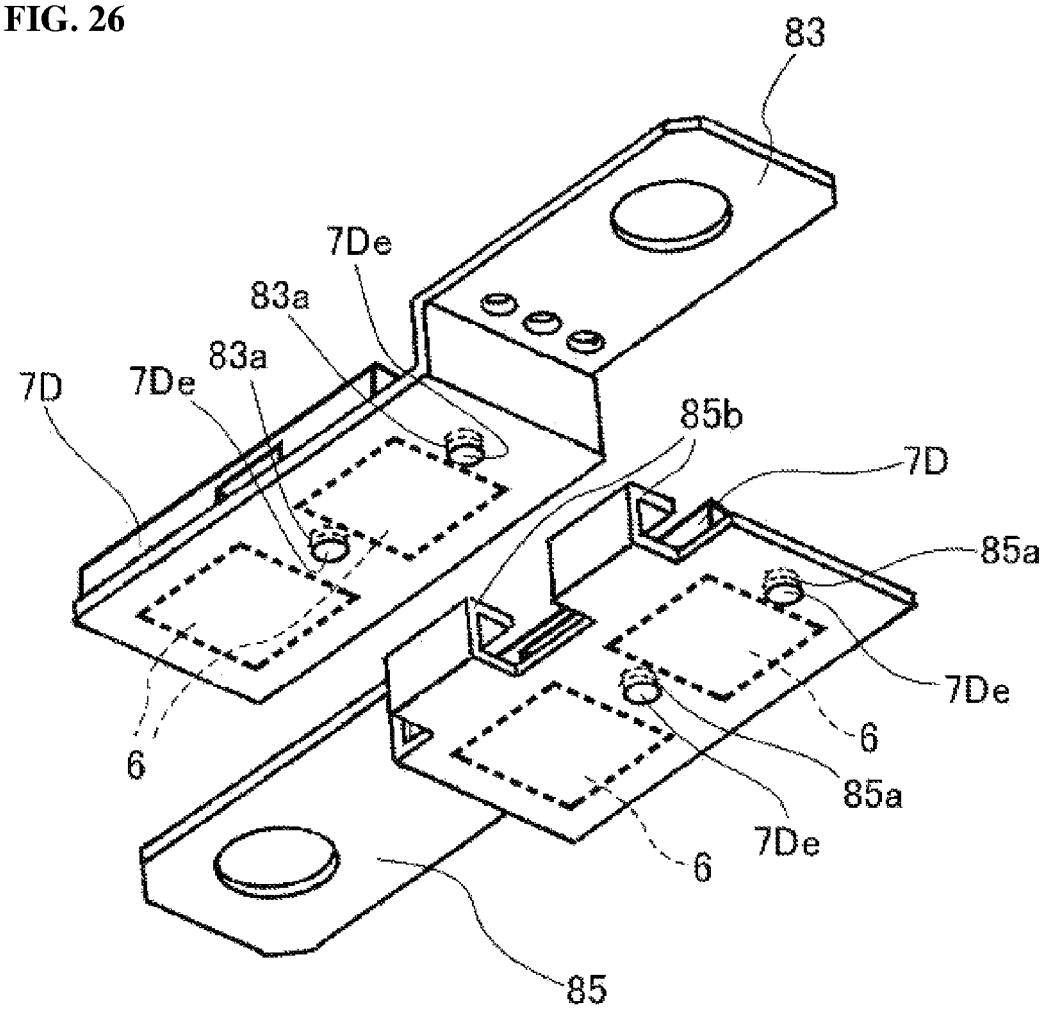
FIG. 26 is a perspective view illustrating terminals attached to a lead pin block, as viewed from a rear surface.
Figure 27:
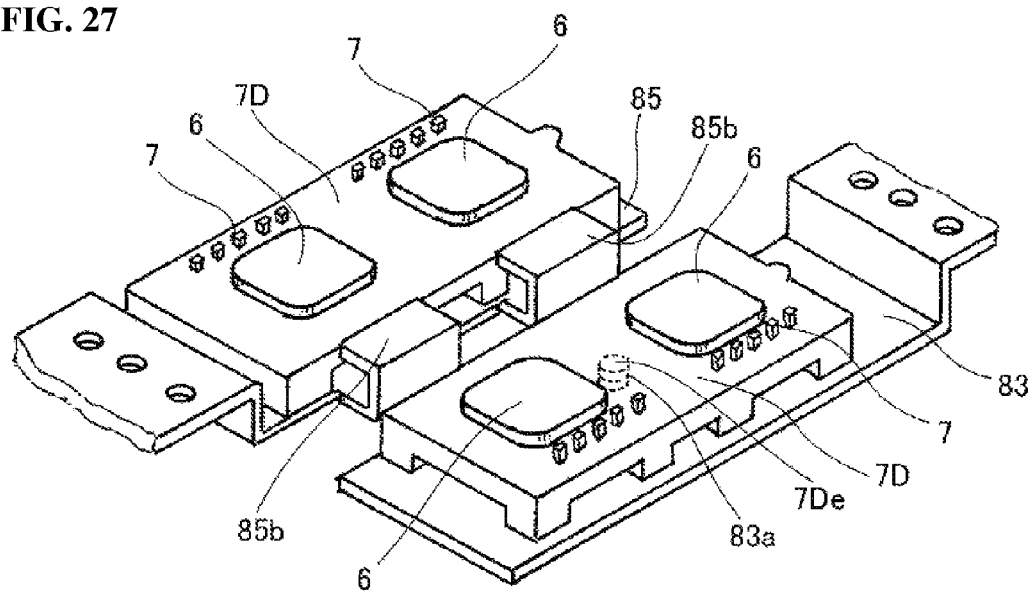
FIG. 27 is an enlarged perspective view illustrating the terminals.

FIG. 26 is a perspective view illustrating the terminals 83 and 85 to which the lead pin blocks 7D are attached, as viewed from the bottom and FIG. 27 is an enlarged perspective view illustrating the terminal 83. The protrusion 7De of the lead pin block 7D is fitted to the hole 83a provided in the terminal 83 to locate the lead pin block 7D at a predetermined position of the terminal 83. In addition, the protrusion 7De of the lead pin block 7D is fitted to the hole 85a provided in the terminal 85 to easily locate the lead pin block 7D at a predetermined position of the terminal 85.

The operation and effect when the lead pin block 7D is provided in the semiconductor device component 80 are the same as those described with reference to FIGS. 12(a), 12(b) or FIG. 14 and thus the description thereof will not be repeated in this embodiment.

Figure 28:
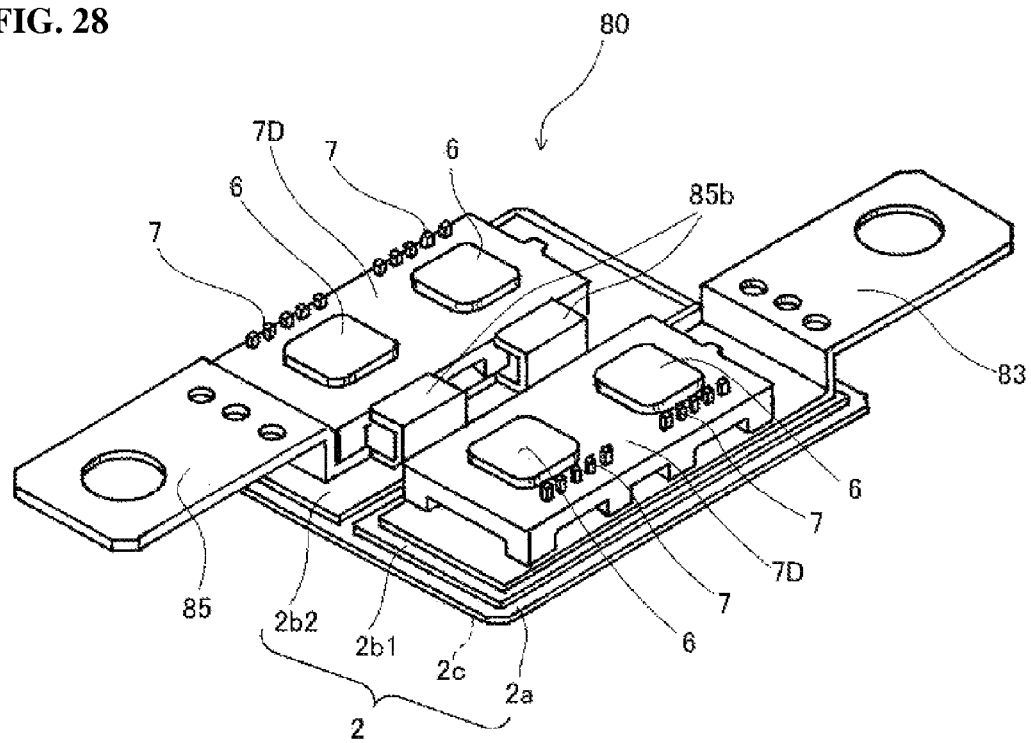
FIG. 28 is a perspective view illustrating the semiconductor device component illustrated in FIG. 25.

FIG. 28 is a perspective view illustrating the semiconductor device component 80 according to this embodiment. The semiconductor device component 80 can be used as a unit module of a power semiconductor module 90 which will be described below.

The power semiconductor module 90 which uses the semiconductor device component 80 illustrated in FIG. 28 as the unit module will be described in the order of the assembly process thereof.

Figure 29:
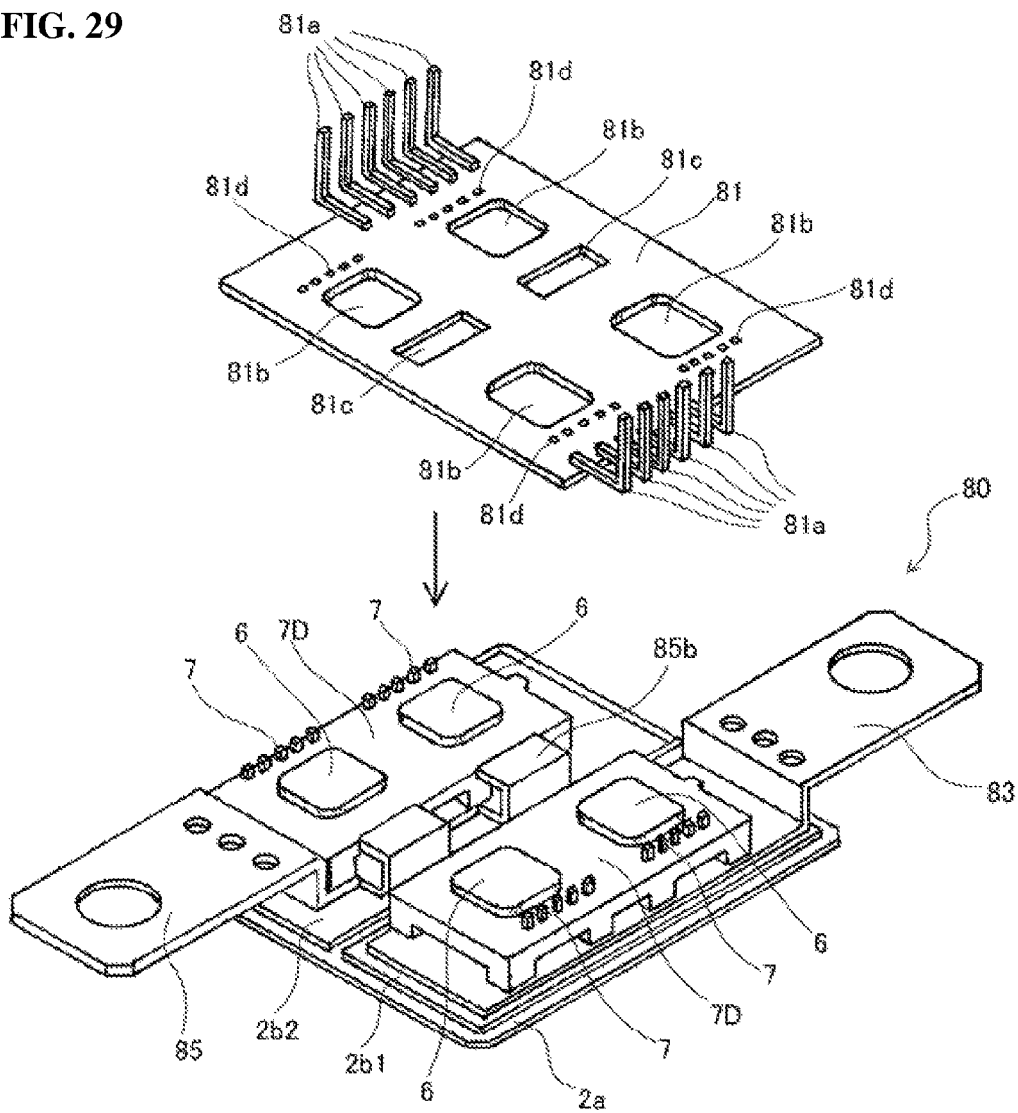
FIG. 29 is a perspective view illustrating a process of assembling a power semiconductor module according to another embodiment of the invention.

First, as illustrated in FIG. 29, the semiconductor device component 80 and a printed circuit board 81 are prepared. The printed circuit board 81 includes a plurality of external lead pins 81a which is electrically connected to the lead pins 7 fixed to the lead pin block 7D of the semiconductor device component 80. In addition, wiring lines for connecting the lead pins 7 fixed to the lead pin block 7D and the external lead pins 81a are formed on the front surface and/or the rear surface of the printed circuit board 81. Openings 81b and 81c through which the radiation blocks 6 integrally fixed to the lead pin block 7D and the feed portions 85b of the terminal 85 are respectively exposed and holes 81d which are used to solder the wiring lines and the lead pins 7 fixed to the lead pin block 7D are formed in the printed circuit board 81.

Figure 30:
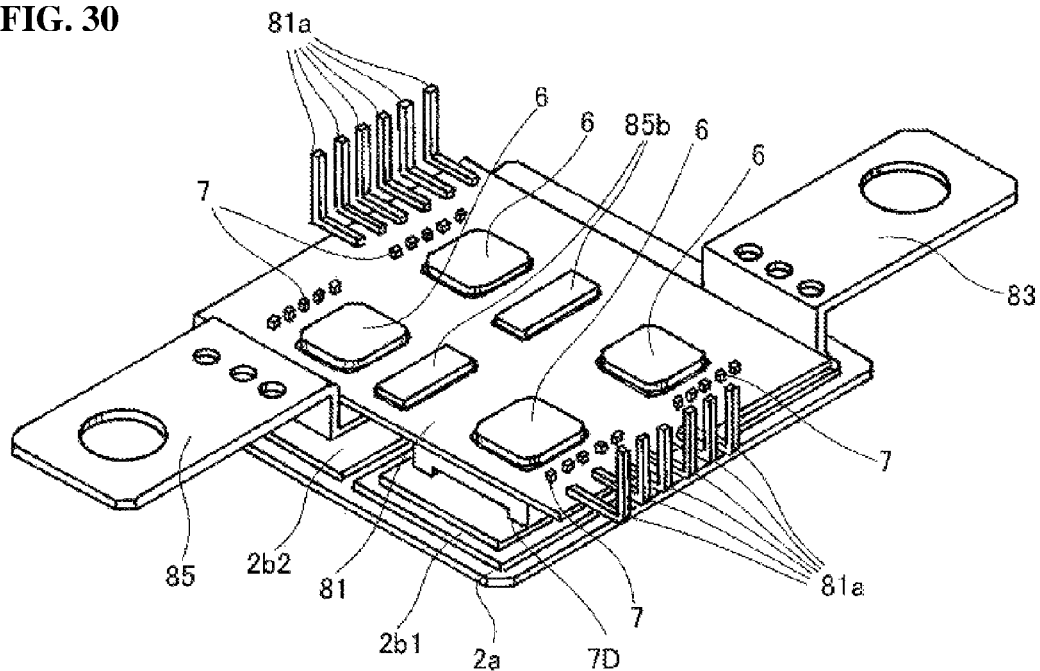
FIG. 30 is a perspective view illustrating the process of assembling the power semiconductor module.

FIG. 30 is a perspective view illustrating a state in which the printed circuit board 81 is attached to the semiconductor device component 80 and the lead pins 7 are electrically connected to the wiring lines of the printed circuit board 81 by soldering or press fitting.

Figure 31:
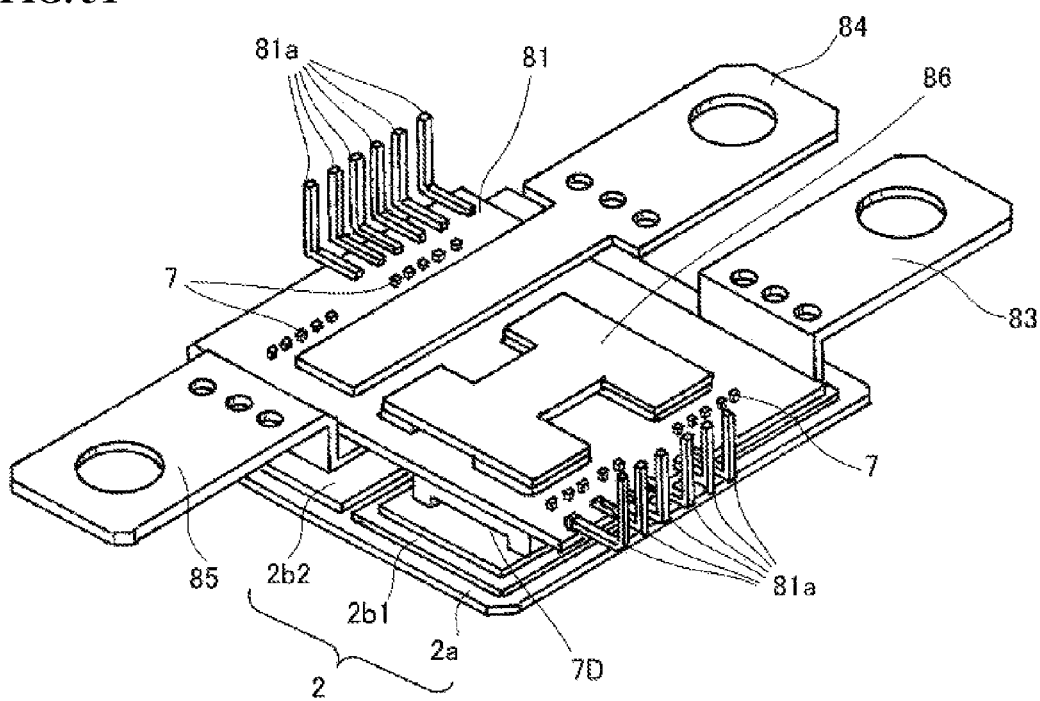
FIG. 31 is a perspective view illustrating the process of assembling the power semiconductor module.

Then, as illustrated in FIG. 31, a bus bar terminal 84 which functions as a bus bar and a terminal is bonded to the radiation blocks 6 which are fixed to the lead pin block 7D attached to the terminal 85 and are exposed through the openings of the printed circuit board 81. In addition, a bus bar 86 is bonded to the feed portions 85b of the terminal 85 and the radiation blocks 6 which are fixed to the lead pin block 7D attached to the terminal 83 and are exposed through the openings of the printed circuit board 81. The bus bar terminal 84 and the bus bar 86 are preferably bonded by laser welding.

Figure 32:
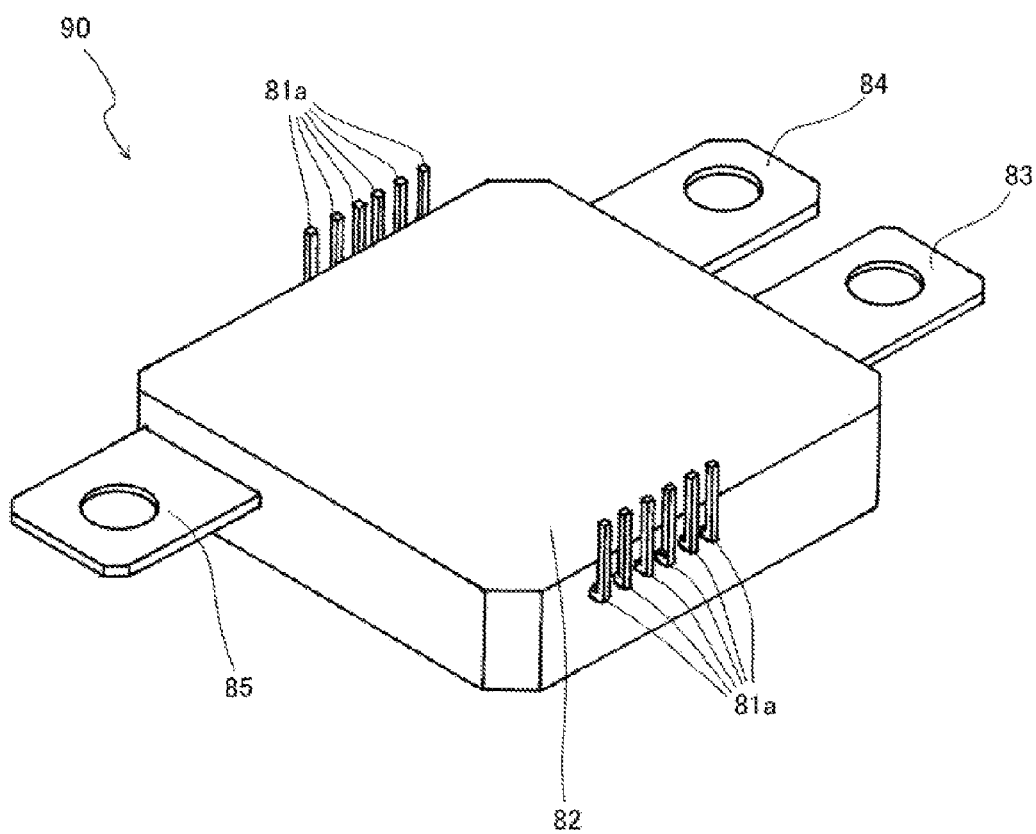
FIG. 32 is a perspective view illustrating the process of assembling the power semiconductor module.

Then, as illustrated in FIG. 32, the structure is sealed with a sealing resin 82 such that terminal portions of the terminals 83 and 85 and the bus bar terminal 84 and the external lead pins 81a are exposed. In this way, the 2-in-1 power semiconductor module 90 is obtained. Instead of the sealing resin 82, the structure may be covered with a case and the case may be sealed with gel or resin to form the power semiconductor module.

The power semiconductor module 90 according to this embodiment includes the radiation block 6 and the lead pin block 7D. Therefore, the power semiconductor module 90 has the same effect as that obtained by the radiation block 6 and the lead pin block according to the above-described embodiments. In addition, the protrusions 7De of the lead pin block 7D are fitted to the holes 83a and 85a of the terminals 83 and 85 to position the lead pin block 7D. Therefore, it is easy to perform positioning.

Various types of solder can be used to bond the semiconductor chip 3 to the radiation block 6, the lead pin 7, and the metal film 2b. For example, plate-shaped solder or paste solder may be used. In addition, a brazing material or paste (sintered metal) including silver nanoparticles may be used instead of the solder.

Embodiment 19

Figure 33:
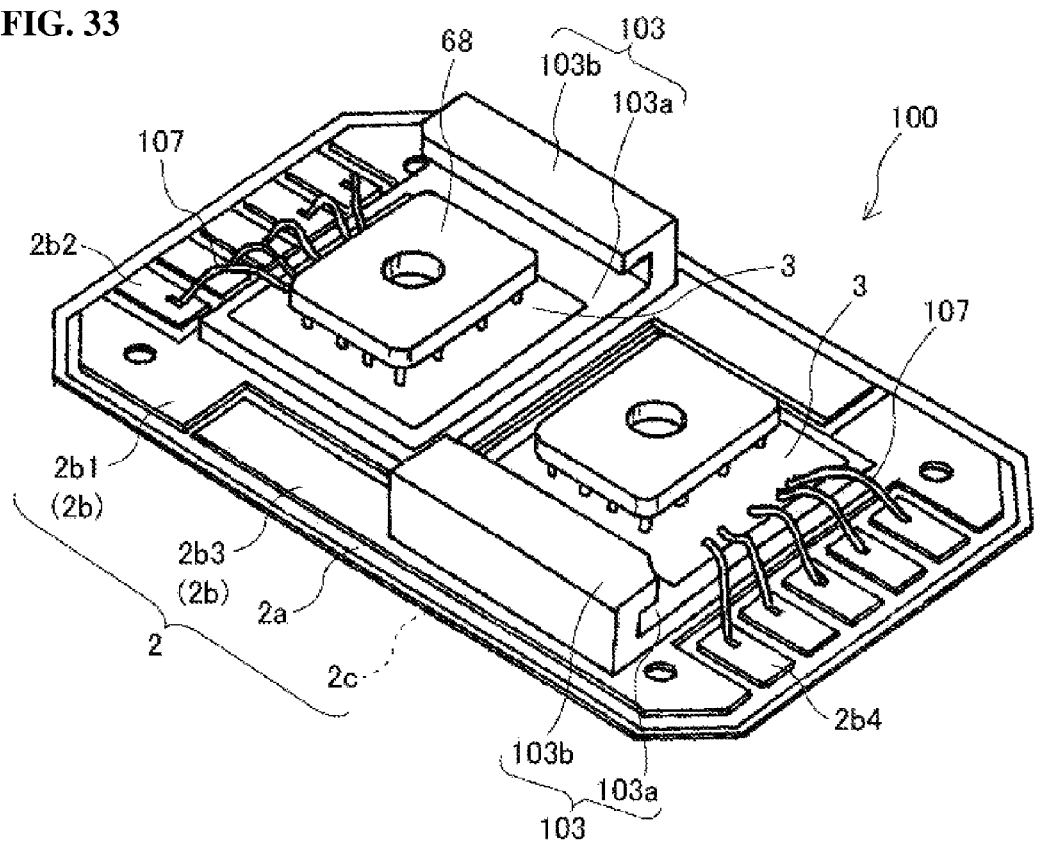
FIG. 33 is a perspective view illustrating a semiconductor device component according to another embodiment of the invention.
Figure 34:
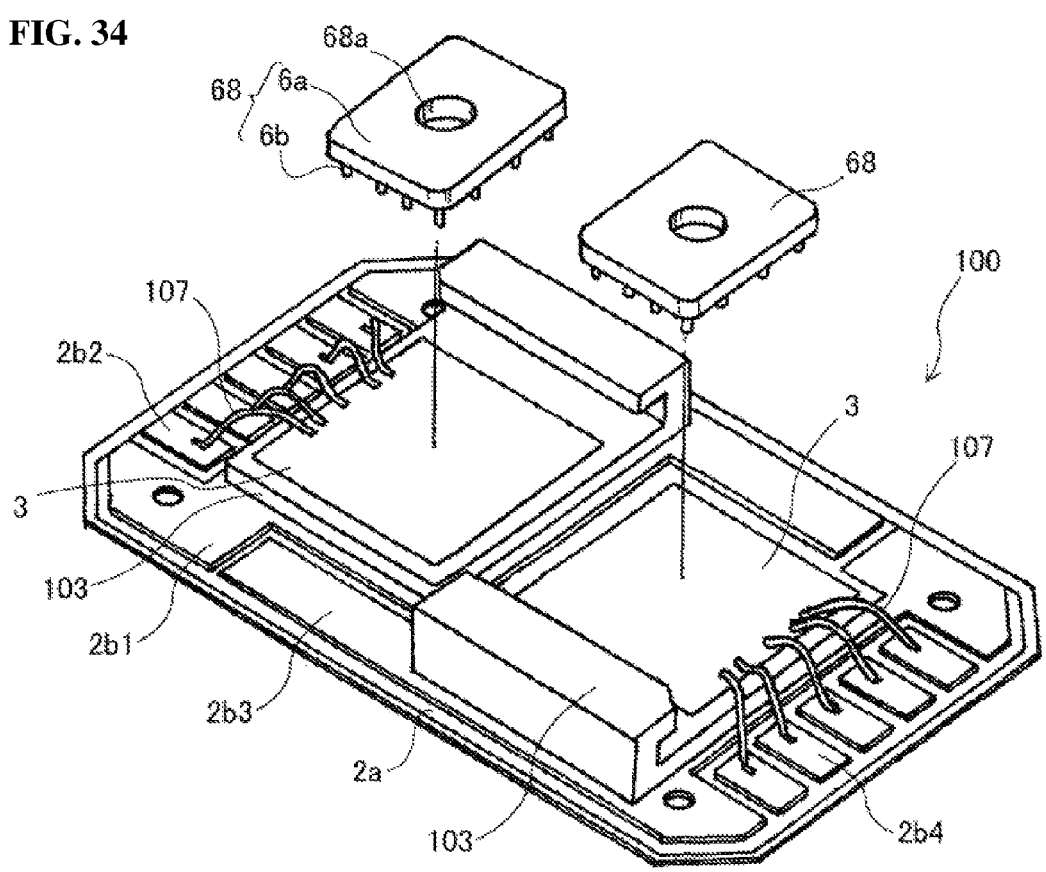
FIG. 34 is an exploded perspective view illustrating the semiconductor device component illustrated in FIG. 33.

Next, another example of the semiconductor device component and the power semiconductor module will be described. A semiconductor device component 100 according to this embodiment is suitable to assembly a 2-in-1 power semiconductor module. In addition, three semiconductor device components 100 may be used to assemble a 6-in-1 power semiconductor module 110, which will be described below. FIG. 33 is a perspective view illustrating the semiconductor device component 100 according to this embodiment and FIG. 34 is an exploded perspective view illustrating the semiconductor device component 100. The semiconductor device component 100 includes an insulating substrate 2, a semiconductor element 3 which is mounted on the insulating substrate 2, and a radiation block 68 which is bonded to the semiconductor element 3 and has a three-dimensional radiation portion. The insulating substrate 2 includes an insulating plate 2a, a metal film 2b which is bonded to one surface of the insulating plate 2a, and a metal film 2c which is bonded to the other surface of the insulating plate 2a. In the perspective view of FIG. 33, the metal film 2c is not illustrated. The metal film 2b divided into a region 2b1, a region 2b2, a region 2b3, and a region 2b4.

In this embodiment, a metal plate 103 may be soldered to each of the regions 2b1 and 2b3 of the metal film 2b. The metal plate 103 includes a flat plate portion 103a which has a substantially rectangular shape in a plan view and a feed portion 103b which is provided at one end of the flat plate portion 103a. A main surface of the feed portion 103b is substantially parallel to a main surface of the flat plate portion 103a. The feed portion 103b is preferably formed by partially bending a copper plate, which is a raw material, when the metal plate 103 is manufactured. In addition, the flat plate portion 103a and the feed portion 103b may be separately formed and bonded to each other. It is preferable that the metal plate 103 soldered to the region 2b1 and the metal plate 103 soldered to the region 2b3 have the same shape in order to suppress an increase in manufacturing costs. The metal plate 103 functions as a heat spreader and improves the radiation performance of the semiconductor chip 3.

The semiconductor chip 3 is soldered to the main surface of the flat plate portion 103a of each of the two metal plates 103 and electrodes formed on the lower surface of the semiconductor chip 3 (for example, a collector electrode and a cathode electrode of an RC-IGBT chip) are electrically connected to the main surface of the flat plate portion 103a. The RC-IGBT chip is used as an example of the semiconductor chip 3. Two RC-IGBT chips are mounted on one insulating substrate 2 to form the upper and lower arms of a power semiconductor module in an inverter apparatus.

The radiation blocks 68 are soldered to electrodes (for example, an emitter electrode and an anode electrode) which are formed on the upper surfaces of the two semiconductor chips 3 and are electrically connected to the electrodes. Similarly to the radiation block according to the above-described embodiments, the radiation block 68 illustrated in FIG. 33 includes a base portion 6a and a three-dimensional radiation portion 6b including a plurality of cylindrical pins which extend from the base portion 6a. A hole 68a is formed at the center of the base portion 6a. The hole 68a is used to observe solder for bonding the semiconductor chip 3 with X-rays or to observe whether a space between the semiconductor chip 3 and the radiation block 68 is sufficiently filled with a sealing material 9.

Other electrodes (for example, gate electrodes) which are formed on the upper surfaces of the two semiconductor chips 3 are electrically connected to the regions 2b2 and 2b4 of the metal film 2b of the insulating substrate by bonding wires 107.

Since the semiconductor device component 100 according to this embodiment includes the radiation block 68, the same effect as that of the radiation block 6 according to the above-described embodiments is obtained.

Next, a power semiconductor module 110 which uses the semiconductor device component 100 as a unit module and a method for assembling power semiconductor module 110 will be described in the order of a manufacturing process, with reference to FIGS. 35 to 39. Finally, the power semiconductor module 110 has the shape illustrated in the perspective view of FIG. 39. The power semiconductor module 110 is a so-called 6-in-1 power semiconductor module in which three semiconductor device components 100 illustrated in FIG. 33 are fixed to a metal substrate 111. The power semiconductor module 110 forms, for example, a three-phase inverter circuit.

Figure 35:
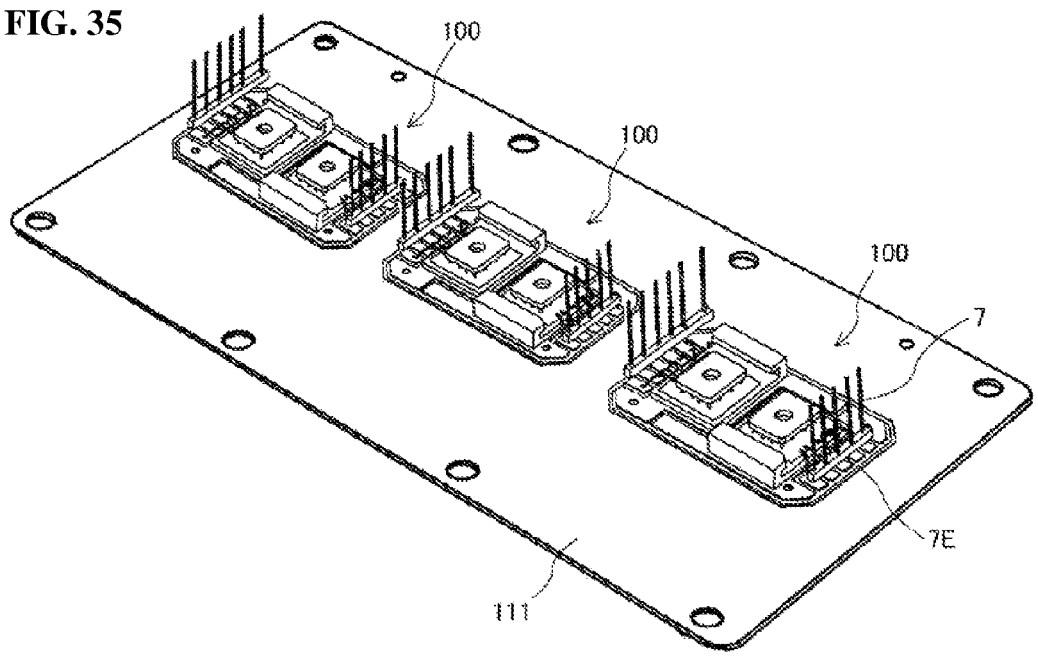
FIG. 35 is a perspective view illustrating a process of assembling a power semiconductor module using the semiconductor device component illustrated in FIG. 33.

First, as illustrated in the perspective view of FIG. 35, three semiconductor device components 100 and the metal substrate 111 are prepared. Each of the semiconductor device components 100 is used as the unit module and includes lead pins 7 which are soldered to the regions 2b2 and 2b4 of the metal film 2b of the insulating substrate 2. Each lead pin 7 is fixed by a lead pin block 7E. Therefore, a plurality of lead pins 7 can be treated as one member. Plate-shaped solder or paste solder is formed at a predetermined position on the metal substrate 111 and the semiconductor device components 100 are positioned by a jig of an assembly apparatus so as to be arranged in a line and are then bonded to the metal substrate 111 by solder.

The bonding between the lead pins 7 and the regions 2b2 and 2b4 and the bonding between the metal substrate 111 and the metal film 2c of the insulating substrate 2 are performed at the same time by performing a heating process in a heating furnace to reflect the solder. At the same time, the radiation block 68 and the semiconductor chip 3 may be bonded to each other.

Cooling fins may be provided on the rear surface of the metal substrate 111 such that a cooling medium passes between the fins. In this case, the metal substrate 111 can function as a portion of a cooling device.

Figure 36:
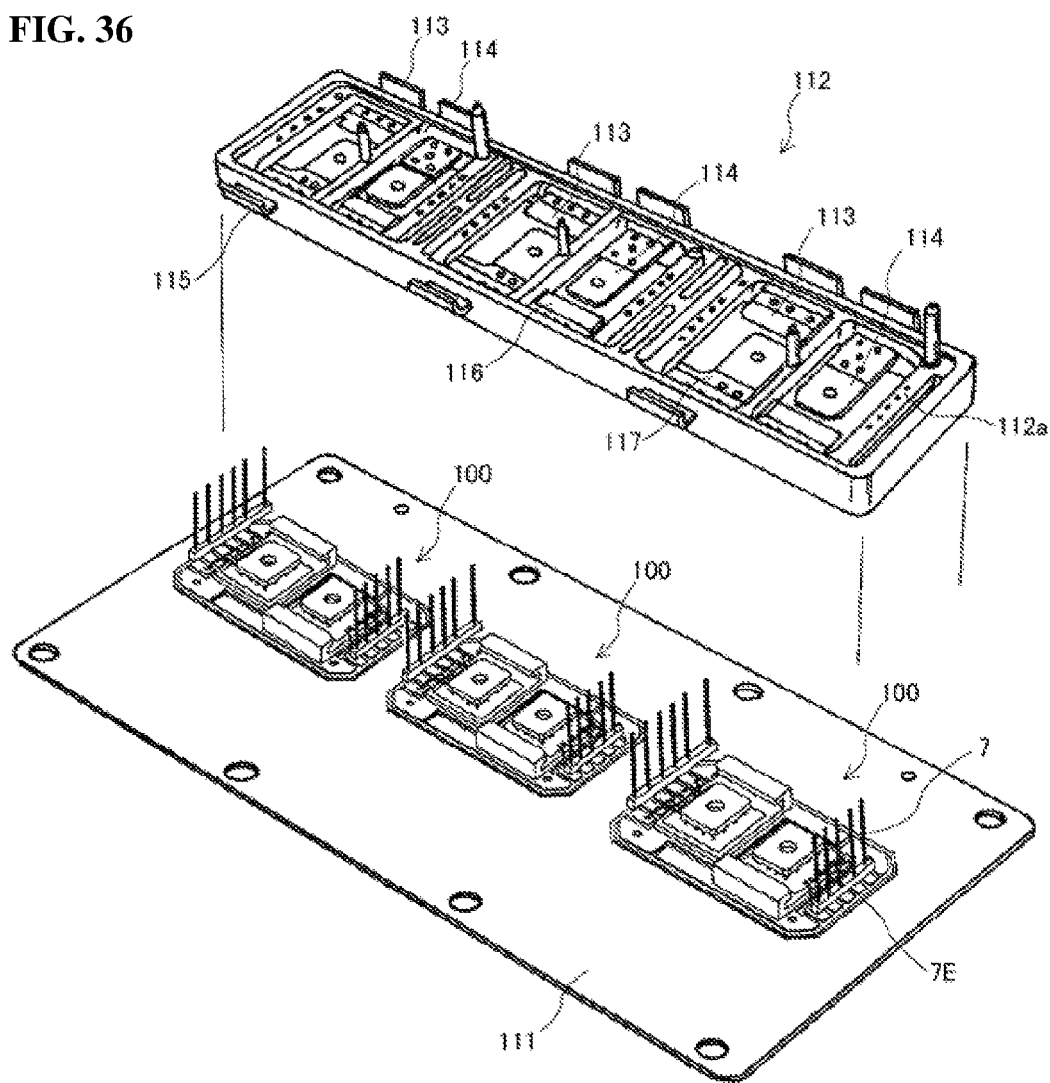
FIG. 36 is a perspective view illustrating the process of assembling the power semiconductor module using the semiconductor device component illustrated in FIG. 33.

Then, as illustrated in the exploded perspective view of FIG. 36, a case 112 is separately prepared. Then, the case 112 is attached to the semiconductor device components 100 and is bonded and fixed to the metal substrate 111.

In the case 112, a P terminal 113 which is electrically connected to the feed portion 103b on the region 2b1, an N terminal 114 which is electrically connected to the radiation block 68 on the region 2b3, and a U terminal 115, a V terminal 116, or W terminal 117 which is electrically connected to the radiation block 68 on the region 2b1 and the feed portion 103b on the region 2b2 in each semiconductor device component 100 are integrally formed. Each terminal functions as a conductive plate which extends to the internal space of the case 112. These terminals are integrated with the case 112 when the case 112 made of a resin is formed by, for example, injection molding.

Figure 37:
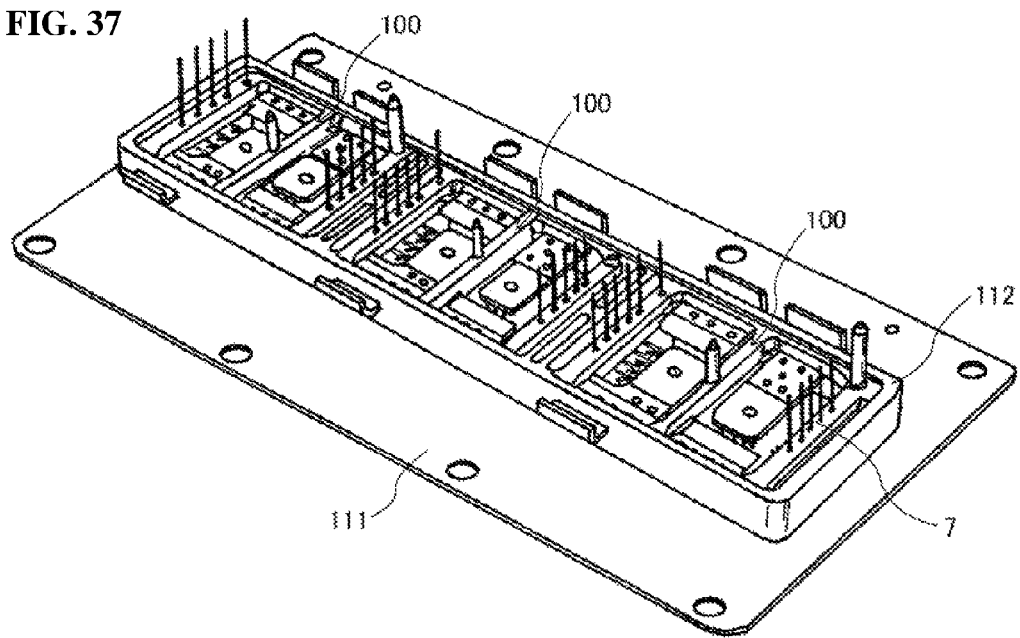
FIG. 37 is a perspective view illustrating the process of assembling the power semiconductor module using the semiconductor device component illustrated in FIG. 33.

Through holes 112a through which the lead pins 7 pass are formed in the case 112. The lead pins 7 pass through the through holes 112a and the leading ends of the lead pins 7 protrude from the case 112. Then, as illustrated in FIG. 37, the case 112 is bonded and fixed to the metal substrate 111.

After the case 112 is bonded and fixed, the P terminal 113 and the N terminal 114 of the case 112 are bonded to the main surface of the feed portion 103b in the upper arm and the main surface of the radiation block 68 in the lower arm in the semiconductor device component. In addition, the U terminal 115, the V terminal 116, and the W terminal 117 are bonded to the main surfaces of the radiation blocks 68 in the upper arm of the semiconductor device component 100. It is preferable that the bonding be performed by laser welding.

In order to protect, for example, the semiconductor chip 3 from sputters during laser welding, it is preferable to inject the sealing material 9 into the case 112 to a height which does not affect the laser welding after the case 112 is bonded and fixed to the metal substrate 111 and before the laser welding is performed. The sealing material 9 is gel or resin with high heat resistance and/or high fluidity, such as silicon gel or epoxy resin.

Figure 38:
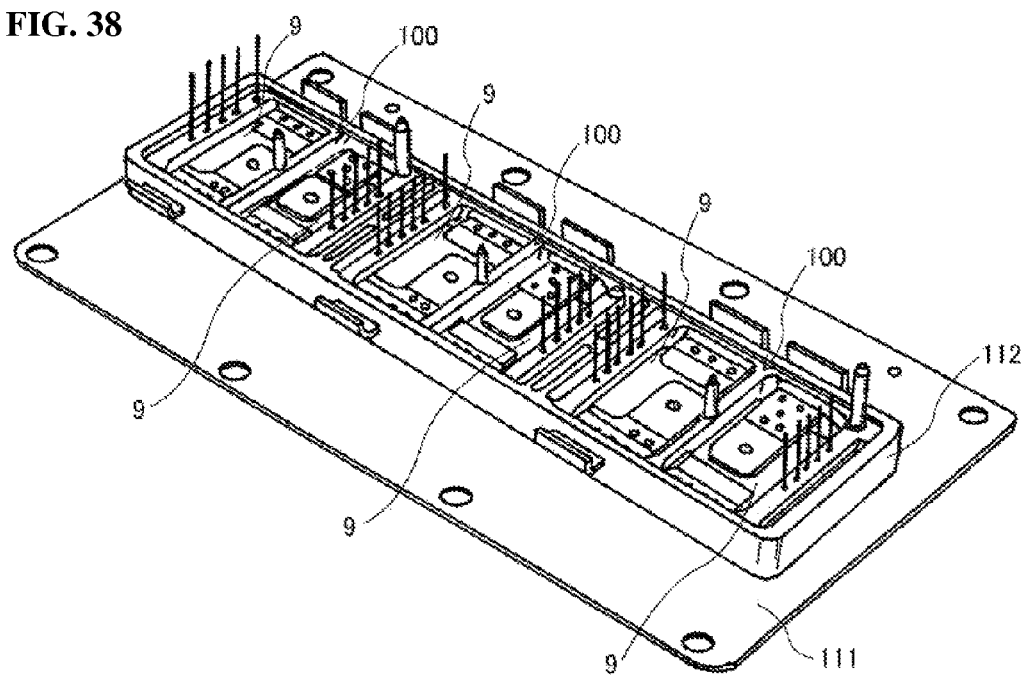
FIG. 38 is a perspective view illustrating the process of assembling the power semiconductor module using the semiconductor device component illustrated in FIG. 33.

FIG. 38 illustrates a shape when the sealing material 9 is injected to the case 112 and the above-mentioned terminals of the case 112 are bonded.

Figure 39:
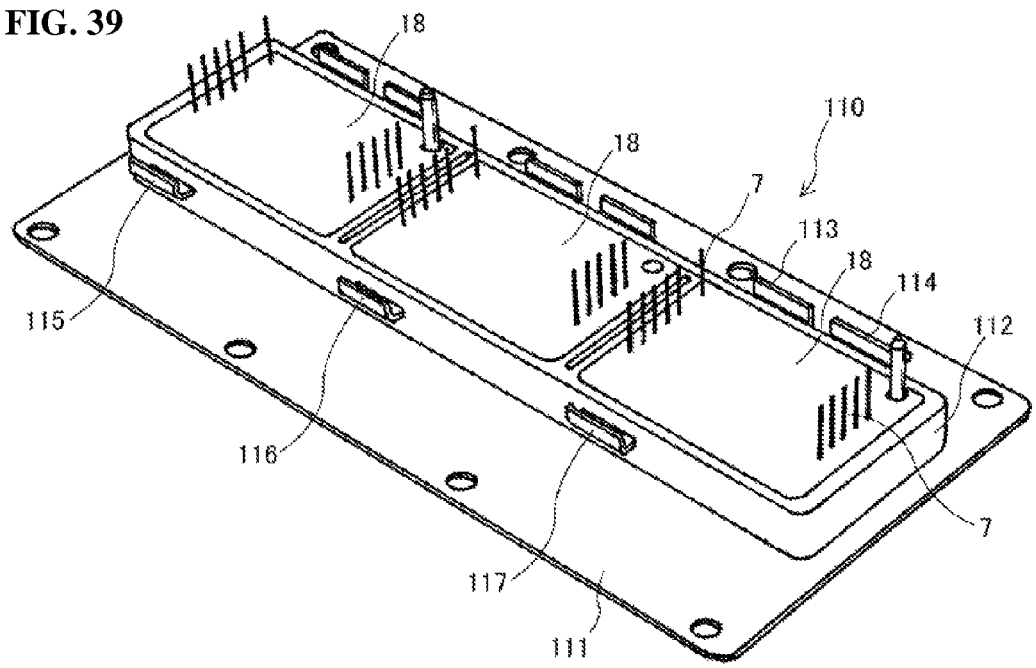
FIG. 39 is a perspective view illustrating the power semiconductor module using the semiconductor device component illustrated in FIG. 33.

After the laser welding, the case is filled with a sealing material 18, as illustrated in FIG. 39. The sealing material which fills the case after the laser welding may be the same type as that injected into the case before the laser welding or an inexpensive sealing material may be used. When the inexpensive sealing material is used, it is possible to use the sealing material having both high heat resistance and low costs in the power semiconductor module 110.

Since the power semiconductor module 110 according to this embodiment includes the radiation block 68, the same effect as that of the structure including the radiation block 6 according to the above-described embodiment is obtained.

Various types of solder can be used to bond the semiconductor chip 3 to the radiation block 6, the lead pins 7, and the metal film 2b. For example, plate-shaped solder or paste solder may be used. In addition, a brazing material or paste (sintered metal) including silver nanoparticles may be used instead of the solder. Components which are bonded by, for example, solder are electrically and mechanically connected. In addition, three cases 112 corresponding to the three semiconductor device components 100 may be used.

Figure 40:
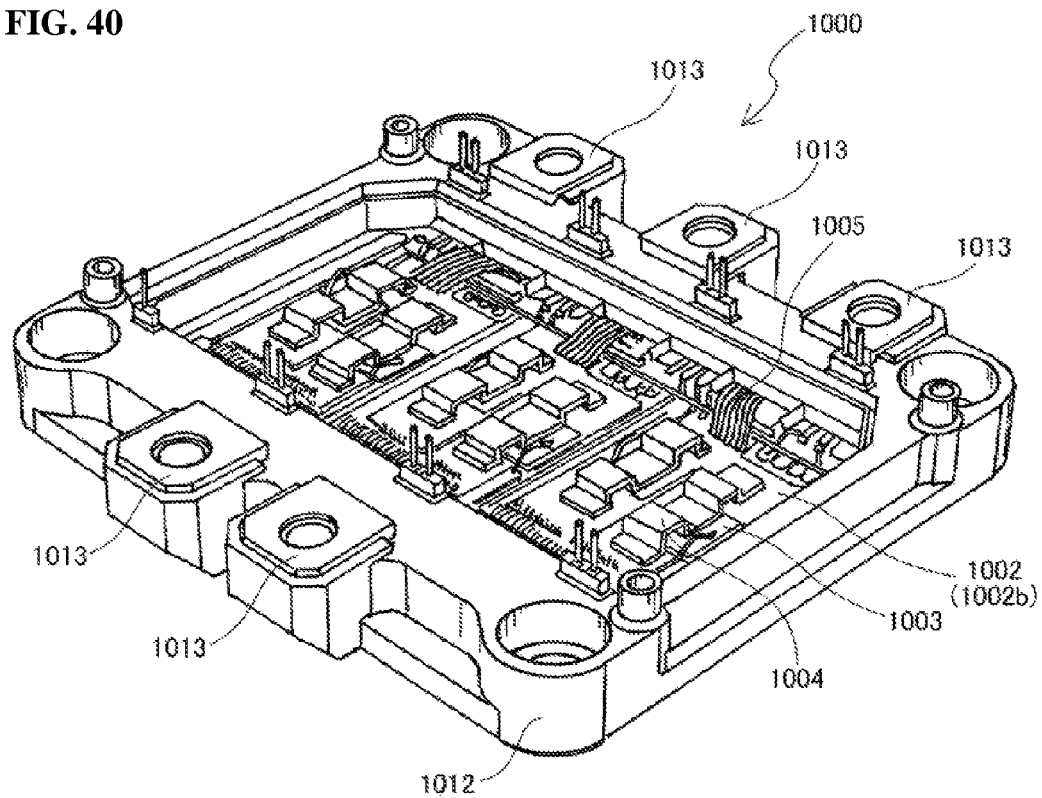
FIG. 40 is a schematic perspective view illustrating a power semiconductor module according to the related art.

FIG. 40 is a perspective view illustrating a power semiconductor module according to the related art, for comparison with the power semiconductor module 20 illustrated in FIG. 10(c) or FIG. 11(d). A power semiconductor module 1000 illustrated in FIG. 40 is a 6-in-1 power semiconductor module.

In the power semiconductor module 1000, a plurality of insulating substrates 1002 is mounted on a metal substrate. A circuit pattern is formed on a metal film 1002b of each insulating substrate 1002. An IGBT chip and an FWD chip are mounted as semiconductor chips 1003 on the metal film 1002b. A lead (conductive plate) 1004 is bonded to an electrode formed on the upper surface of the semiconductor chip 1003 by laser welding. The lead 1004 is soldered to the metal film 1002b of the insulating substrate 1002 and is electrically connected thereto. In addition, terminals 1013 which are formed in a case 112 by insert molding are electrically connected to the metal film 1002b by bonding wires 1005.

In the power semiconductor module 1000 according to the related art illustrated in FIG. 40, the electrode formed on the upper surface of the semiconductor chip 1003 is soldered to the lead 1004 and is electrically connected thereto. In contrast, in the power semiconductor module 20 according to the embodiment of the invention illustrated in FIGS. 10(a)-10(d) and 11(a)-11(d), the electrode formed on the upper surface of the semiconductor chip 3 is soldered to the radiation block 6 and is electrically connected to the conductive plate through the radiation block 6. Therefore, the power semiconductor module 20 according to the embodiment of the invention has a higher radiation performance and higher long-term reliability than the power semiconductor module 1000 according to the related art.

EXPLANATIONS OF LETTERS OR NUMERALS 1, 30, 40, 50, 80, 100 SEMICONDUCTOR DEVICE COMPONENT
2 INSULATING SUBSTRATE
3 SEMICONDUCTOR ELEMENT (SEMICONDUCTOR CHIP)
4 FEED BLOCK
5 BONDING WIRE
6 RADIATION BLOCK
7 LEAD PIN
7A, 7B, 7C, 7D LEAD PIN BLOCK
8 FRAME
9 SEALING MATERIAL
10 UNIT MODULE
11, 71 METAL SUBSTRATE
12, 72 CASE
13, 14, 15, 16, 17, 73, 74, 75, 76, 77 TERMINAL
18 SEALING MATERIAL
20, 70, 90, 110 POWER SEMICONDUCTOR MODULE (SEMICONDUCTOR DEVICE)

What is claimed is:

1. A semiconductor device comprising:
an insulating substrate;
a semiconductor element mounted on the insulating substrate, and having first electrodes connected to bonding wires and second electrodes on an upper surface thereof;
a radiation block including a base portion, and a radiation portion integrally formed with the base portion and extending from the base portion, the radiation portion having a plurality of pins or fins and bonded to the second electrodes of the semiconductor element;
a plurality of metal film regions formed on the insulating substrate and connected to the first electrodes through the bonding wires;
a plurality of lead pins electrically and mechanically connected to the plurality of metal film regions, and
a metal substrate fixed with one unit module,
wherein the one unit module comprises the insulating substrate, the semiconductor element, the radiation block, the plurality of metal film regions and the plurality of lead pins, a frame made of resin and provided in a periphery of the insulating substrate, and a sealing material filled inside the frame so that the plurality of pins or fins is completely covered by the sealing material, and the base portion and the plurality of lead pins are exposed from the sealing material.

2. The semiconductor device according to claim 1, further comprising: a conductive plate electrically connected to the semiconductor element through the radiation block.

3. The semiconductor device according to claim 1, further comprising a lead pin block integrally fixing the plurality of lead pins together.

4. The semiconductor device according to claim 1, wherein a plurality of unit modules, each being formed of said one unit module, is mounted on the metal substrate, and semiconductor elements of the plurality of said unit modules are electrically connected with a conductive plate.

5. The semiconductor device according to claim 1, further comprising: a metal plate provided between the insulating substrate and the semiconductor element.

6. The semiconductor device according to claim 1, wherein the one unit module further comprises a lead pin block integrally fixing the plurality of lead pins together.

7. The semiconductor device according to claim 6, wherein the radiation block and the lead pin block are separately provided.

8. The semiconductor device according to claim 1, wherein the frame includes a protrusion provided on a bottom thereof.

9. The semiconductor device according to claim 1, further comprising: a case accommodating the metal substrate, and another sealing material filled inside the case.

10. The semiconductor device according to claim 9, wherein said another sealing material filled inside the case is formed from a material different from the sealing material filled inside the frame.

11. The semiconductor device according to claim 1, further comprising a feed block mounted on the insulating substrate and supplying power from outside to the semiconductor element, the feed block being located inside the frame so that an upper surface of the feed block is exposed from the sealing material.

12. A method for assembling a semiconductor device, comprising:
   preparing a unit module including an insulating substrate, a semiconductor element mounted on the insulating substrate having first electrodes, a radiation block bonded to the semiconductor element and having a base portion and a radiation portion integrally formed together to form a three-dimensional radiation portion, a plurality of metal film regions formed on the insulating substrate and connected to the first electrodes;
   fixing the unit module to a metal substrate;
   arranging a frame made of resin in a periphery of the insulating substrate of the unit module fixed to the metal substrate;
   electrically and mechanically connecting a plurality of lead pins to the plurality of metal film regions;
   filling a sealing material inside the frame so that the radiation portion is completely covered by the sealing material, and the base portion and the plurality of lead pins are exposed from the sealing material;
   arranging a case to enclose the frame; and
   bonding the case to the metal substrate.

13. A method for assembling a semiconductor device, comprising:
   preparing an insulating substrate; a semiconductor element mounted on the insulating substrate, and having first electrodes connected to bonding wires and second electrodes on an upper surface thereof; a radiation block including a base portion, and a radiation portion integrally formed with the base portion and extending from the base portion, the radiation portion having a plurality of pins or fins and bonded to the second electrodes of the semiconductor element; a plurality of metal film regions formed on the insulating substrate and connected to the first electrodes through the bonding wires; a plurality of lead pins electrically and mechanically connected to the plurality of metal film regions; and a frame made of resin and fixed to a periphery of the insulating substrate, the frame surrounding the semiconductor element the radiation block, the plurality of metal film regions and the plurality of lead pins;
   filling a sealing material inside of the frame such that the plurality of pins or fins is completely covered by the sealing material, and the base portion and the plurality of lead pins are exposed from the sealing material, to thereby prepare a unit module;
   fixing the unit module to a metal substrate; and
   bonding a case enclosing the unit module to the metal substrate.

* * * * *